(12) United States Patent
Sato et al.

(10) Patent No.: US 7,998,793 B2
(45) Date of Patent: Aug. 16, 2011

(54) LIGHT ILLUMINATION DURING WAFER DICING TO PREVENT ALUMINUM CORROSION

(75) Inventors: Takashi Sato, Tokyo (JP); Junichi Takano, Tokyo (JP); Takashi Sato, Enzan (JP); Tokuo Naitou, Enzan (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 71 days.

(21) Appl. No.: 12/434,637

(22) Filed: May 2, 2009

(65) Prior Publication Data

US 2009/0215247 A1 Aug. 27, 2009

Related U.S. Application Data

(63) Continuation of application No. 11/632,993, filed as application No. PCT/JP2004/010780 on Jul. 22, 2004, now abandoned.

(51) Int. Cl.
*H01L 21/00* (2006.01)
(52) U.S. Cl. .............. 438/113; 438/460; 257/E23.158
(58) Field of Classification Search .............. 438/113, 438/460; 257/E23.158
See application file for complete search history.

(56) References Cited

U.S. PATENT DOCUMENTS

| | | | |
|---|---|---|---|
| 4,213,117 A | | 7/1980 | Kembo et al. |
| 5,668,033 A | * | 9/1997 | Ohara et al. .............. 438/113 |
| 5,716,459 A | * | 2/1998 | Chang et al. .............. 136/249 |
| 5,842,461 A | * | 12/1998 | Azuma .............. 125/13.01 |
| 5,904,547 A | | 5/1999 | Flynn |
| 5,972,154 A | | 10/1999 | Konya |
| 6,153,043 A | | 11/2000 | Edelstein et al. |
| 6,283,440 B1 | | 9/2001 | Evans |
| 6,582,983 B1 | | 6/2003 | Runyon et al. |
| 6,989,608 B2 | | 1/2006 | Rochette |
| 7,288,466 B2 | | 10/2007 | Takeishi et al. |
| 2002/0173229 A1 | | 11/2002 | Kobayashi |
| 2003/0034120 A1 | | 2/2003 | Yanagisawa et al. |

(Continued)

FOREIGN PATENT DOCUMENTS

EP 0 831 357 A2 3/1998

(Continued)

OTHER PUBLICATIONS

Office Action from counterpart Chinese Appln. No. 2004-800438858.

*Primary Examiner* — Hsien-ming Lee
*Assistant Examiner* — Kevin Parendo
(74) *Attorney, Agent, or Firm* — Miles & Stockbridge P.C.

(57) ABSTRACT

Illumination devices (7a) and (7b) which irradiate light having a wavelength of 1.1 μm or less are arranged on a front surface and a rear surface of a cover (8) of a dicing device (1). After a wafer is placed on a dicing stage (3), when the wafer is diced by a blade (4a) attached to a spindle (5), light is irradiated on an entire surface of an upper surface (element forming surface) of the wafer by the illumination devices (7a) and (7b). At this time, an illuminance of light on the wafer is set at 70 lux or more and 2000 lux or less. By this means, during a dicing operation, an area to be a light-shielded area by the spindle (5) or the like is not present on the wafer.

8 Claims, 24 Drawing Sheets

U.S. PATENT DOCUMENTS

| | | | |
|---|---|---|---|
| 2003/0118476 A1* | 6/2003 | Fujii et al. | 422/40 |
| 2004/0065851 A1* | 4/2004 | Inoue | 250/504 R |
| 2004/0089282 A1 | 5/2004 | Akram et al. | |

FOREIGN PATENT DOCUMENTS

| | | |
|---|---|---|
| JP | 54-130880 A | 10/1979 |
| JP | 5-259275 A | 10/1993 |
| JP | 6-232255 A | 8/1994 |
| JP | 6-252144 A | 9/1994 |
| JP | 9-17752 A | 1/1997 |
| JP | 10-90671 A | 4/1998 |
| JP | 11-274114 A | 10/1999 |
| JP | 11-297644 A | 10/1999 |
| JP | 2001-211044 A | 8/2001 |
| JP | 2004-095856 A | 3/2004 |
| JP | 2005-313253 A | 11/2005 |

* cited by examiner

FIG. 8
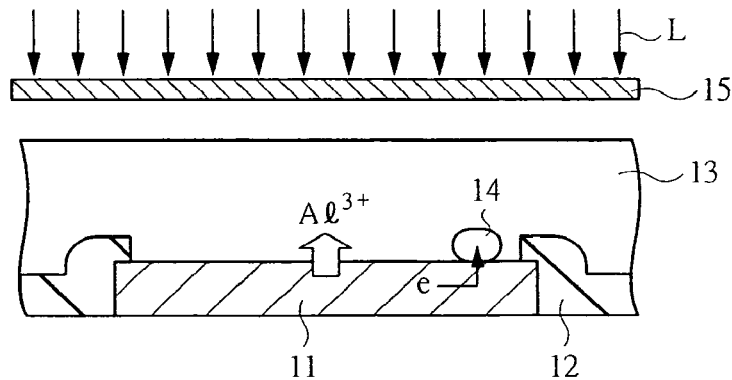
FIG. 9
| | | OXIDATION-REDUCTION POTENTIAL |
|---|---|---|
| (1) | $SiO_2 + 4H^+ + 4e^- \rightleftharpoons Si + 2H_2O$ | -0.86V |
| (2) | $Al^{3+} + 3e^- \rightleftharpoons Al$ | -1.66V |
FIG. 10
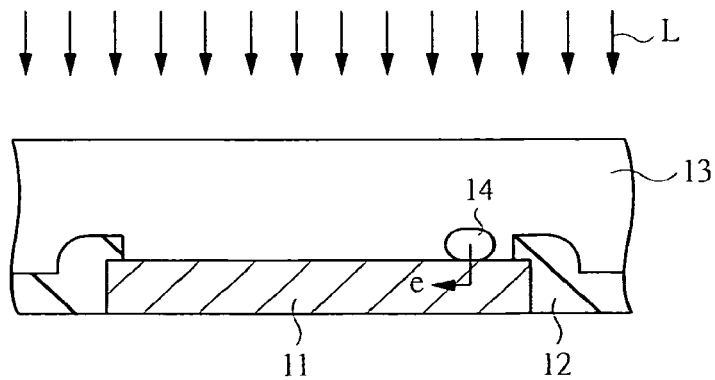

LIGHT ILLUMINATION DURING WAFER DICING TO PREVENT ALUMINUM CORROSION

CROSS-REFERENCE TO RELATED APPLICATION

This application is a continuation of application Ser. No. 11/632,993 filed Jan. 22, 2007 now abandoned, which is a 371 of International Patent Application No. PCT/JP2004/010780 filed Jul. 22, 2004.

TECHNICAL FIELD

The present invention relates to a manufacturing technology for a semiconductor device. More particularly, it relates to a technology effectively applied to the process of dividing a semiconductor wafer (simply referred to as a wafer hereinafter) into respective chips by dicing.

BACKGROUND ART

In Japanese Patent Application Laid-Open Publication No. 2001-211044, a technology is described, in which a soft X-ray is irradiated onto a wafer waiting for dicing, thereby removing the electricity of the wafer in order to prevent the corrosion of electrodes due to the reaction between ions of water supplied during dicing and the electrodes formed on the wafer, and then dicing of the wafer is performed.

In Japanese Patent Application Laid-Open Publication No. 05-259275, the following technology is described. That is, in order to prevent broken pieces made by breakage and crack of a wafer in a dicing process from adhering to a surface (element forming surface) of the wafer, a temporary fixing sheet is attached to the surface of the wafer. Then, the surface side of the wafer to which the temporary fixing sheet is attached is directed downward and an infrared ray is irradiated thereto by an infrared lamp from below. Next, after the infrared ray transmitted through the wafer is detected by an infrared camera provided on the rear surface side of the wafer to recognize the patterns of semiconductor elements, scrub lines are formed on the rear surface of the wafer with a diamond cutter.

In Japanese Patent Application Laid-Open Publication No. 09-017752 (corresponding to U.S. Pat. No. 5,972,154), a technology is described, in which an ultraviolet irradiating device is provided in front of a blade, adhesive force between a dicing tape and a wafer is reduced by an ultraviolet ray irradiated from the ultraviolet irradiating device, and then an area where the adhesive force is reduced is diced with the blade.

In Japanese Patent Application Laid-Open Publication No. 06-232255, a technology is described, in which a wafer surface (element forming surface) is directed downward and an infrared ray is irradiated from a rear surface side of a wafer (upper side). Then, the irradiated infrared ray is detected using an infrared camera to recognize circuit patterns formed on the surface of the wafer and perform the alignment. Thereafter, the dicing is performed.

In Japanese Patent Application Laid-Open Publication No. 11-297644, a technology is described, in a method of dicing a wafer adhered to an adhesive tape with a blade, an ultraviolet ray is irradiated on the blade in the dicing so as to reduce the stickiness of an adhesive paste adhering to the blade, thereby easily removing the adhesive paste from the blade.

In Japanese Patent Application Laid-Open Publication No. 11-274114 (corresponding U.S. Pat. No. 6,153,043), a technology for preventing the dissolution or corrosion of a metal conductor caused by exposing a semiconductor element to light particularly in a polishing process using the chemical mechanical polishing (CMP) is described. More specifically, a technology in which the semiconductor elements are shielded from light which causes a photoelectric effect to prevent the metal conductor from being electrochemically dissolved is described.

DISCLOSURE OF THE INVENTION

In the manufacturing process of a semiconductor device, semiconductor elements and multilevel interconnections are formed on a wafer in general, and bonding pads (electrodes) are formed on an uppermost layer. The bonding pads are external extraction electrodes formed of a material such as aluminum, aluminum silicon (AlSi), or aluminum-copper-silicon (AlCuSi) containing aluminum as a main component. The bonding pads are used for, for example, an input/output terminal, a power source, grounding, and others of an IC (Integrated Circuit).

The wafer on which bonding pads are formed is divided into respective chips by dicing. The inventors of the present invention have examined the dicing for dividing a wafer into respective chips and have found the following problems in the examination. More specifically, in dicing, a wafer is divided into respective chips by rotating a cutting blade called a blade while supplying cooling water. At this time, a large number of silicon pieces generated when the wafer is cut are attached to the wafer. Since dicing is performed in a state where an element forming surface of a wafer is directed upward in general, the silicon pieces are attached to bonding pads. Since the bonding pads are made of a material containing aluminum as a main component as described above, aluminum and silicon pieces are brought into contact with each other after the dicing. When the aluminum and the silicon pieces are brought into contact with each other in this manner, electrons are discharged from aluminum to silicon, and aluminum itself is ionized and dissolved into the cooling water, i.e., the so-called Galvanic corrosion occurs. For this reason, the bonding pads made of a material containing aluminum as a main component are disadvantageously corroded (eliminated).

In this case, as conceivable countermeasures against the corrosion of bonding pads, a dicing speed is increased or the dicing is performed after a wafer is cut into ¼. By this means, time required to cause an electrochemical reaction between aluminum and silicon pieces is not given.

However, chips have been more and more miniaturized in recent years, and the number of chips acquired from one wafer has been increasing. Therefore, since the number of lines for dicing increases, it is difficult to shorten the time required until one wafer is entirely diced. Further, in the case where the dicing is performed after a wafer is cut into ¼, a new step of cutting the wafer into ¼ is required and the efficiency of the process is reduced.

An object of one invention disclosed in this application is to provide a technology capable of suppressing the corrosion of electrodes which occurs when silicon pieces are adhered to the electrodes containing aluminum as a main component in dicing of a semiconductor wafer.

The typical ones of the inventions disclosed in this application will be briefly described as follows.

One invention disclosed in this application is a manufacturing method of a semiconductor device which includes: (a) a step of forming electrodes containing aluminum as a main component on a semiconductor wafer; and (b) a step of dicing the semiconductor wafer while supplying cooling water to the semiconductor wafer to divide the semiconductor wafer into respective chips, wherein, in the step (b), the semiconductor wafer is diced while irradiating light on an entire surface of an element forming surface of the semiconductor wafer so as to prevent corrosion of the electrodes.

An outline of another invention disclosed in this application will be itemized as follows.

1. A manufacturing method of a semiconductor device includes:

(a) a step of placing a wafer on which a wafer process has been completed on a dicing stage (a wafer fixed to a frame through an adhesive sheet is held on a stage in general) in a dicing process unit covered with a semi-transparent cover (light-shielding rate of not less than 50%) or a light-shielding cover (light-shielding rate of not less than 90%) in a dicing device (device used to pelletize a wafer by a rotating blade);

(b) a step of performing two-step cutting (complete cutting, almost complete cutting, or a half or a considerable part may be left) to a scribe area from a first main surface by first and second dicing blades held so that side surfaces thereof are opposed to each other while supplying water or chemical solution containing water as a main component (pure water or the like) to the first main surface of the wafer on which a semiconductor device having electrodes containing aluminum as a main component is formed (although cutting time per wafer is not particularly limited, the step is effective for a case of not less than 20 minutes, especially, not less than 30 minutes. Furthermore, the step is almost indispensable for a case of not less than 40 minutes), wherein, in the step (b), an average illuminance of the first main surface is kept at not less than 70 lux (the average illuminance is obtained by averaging macroscopic illuminances on the first main surface of a wafer on the entire first main surface and process time in the step (b). In this case, the macroscopic illuminances are obtained by averaging illuminances in, for example, 1-cm-square areas and different from microscopic illuminances in micron-order areas).

2. In the manufacturing method of a semiconductor device according to the item 1, in the step (b), a minimum illuminance on the first main surface (minimum illuminance of illuminances obtained by averaging the macroscopic illuminances on the main surface of the wafer by the process time in the step (b)) is kept so that the illuminance does not become lower than 70 lux at any positions on the first main surface.

3. In the manufacturing method of a semiconductor device according to the item 1 or 2, the illuminance in the step (b) is kept by an illumination lamp disposed in the dicing device.

4. In the manufacturing method of a semiconductor device according to any one of the items 1 to 3, the illuminance in the step (b) is kept by a plurality of illumination lamps disposed in the dicing device.

5. In the manufacturing method of a semiconductor device according to any one of the items 1 to 4, the average illuminance is not less than 70 lux and less than 2000 lux.

6. In the manufacturing method of a semiconductor device according to any one of the items 1 to 4, the average illuminance is not less than 80 lux and less than 1500 lux.

7. In the manufacturing method of a semiconductor device according to any one of the items 1 to 4, the average illuminance is not less than 90 lux and less than 1300 lux.

8. In the manufacturing method of a semiconductor device according to any one of the items 1 to 4, the average illuminance is not less than 100 and less than 1200 lux.

9. In the manufacturing method of a semiconductor device according to any one of the items 1 to 4, the average illuminance is not less than 80 lux and less than 500 lux.

10. In the manufacturing method of a semiconductor device according to any one of the items 1 to 4, the average illuminance is not less than 90 and less than 300 lux.

11. A manufacturing method of a semiconductor device includes:

(a) a step of placing a wafer on which a wafer process has been completed on a dicing stage in a dicing process unit in a dicing device; and (b) a step of performing two-step cutting to a scribe area from a first main surface by first and second dicing blades held so as to belong to substantially the same plane while supplying water or chemical solution containing water as a main component to the first main surface of the wafer on which a semiconductor device having electrodes containing aluminum as a main component is formed, wherein, in the step (b), an average illuminance of the first main surface is kept at not less than 70 lux, and a minimum illuminance on the first main surface is kept so that the illuminance does not become lower than 70 lux at any positions on the first main surface.

12. In the manufacturing method of a semiconductor device according to the item 11, the average illuminance and the minimum illuminance on the first main surface are not less than 70 lux and less than 2000 lux.

13. In the manufacturing method of a semiconductor device according to the item 11, the average illuminance and the minimum illuminance on the first main surface are not less than 80 lux and less than 1500 lux.

14. In the manufacturing method of a semiconductor device according to the item 11, the average illuminance and the minimum illuminance on the first main surface are not less than 90 lux and less than 1300 lux.

15. In the manufacturing method of a semiconductor device according to the item 11, the average illuminance and the minimum illuminance on the first main surface are not less than 100 lux and less than 1200 lux.

16. In the manufacturing method of a semiconductor device according to the item 11, the average illuminance and the minimum illuminance on the first main surface are not less than 80 lux.

17. In the manufacturing method of a semiconductor device according to any one of the items 11 to 16, the illuminance during the step (b) is kept by an illumination lamp disposed in the dicing device.

18. In the manufacturing method of a semiconductor device according to any one of the items 11 to 17, the illuminance during the step (b) is kept by a plurality of illumination lamps disposed in the dicing device.

19. A manufacturing method of a semiconductor device includes:

(a) a step of placing a wafer on which a wafer process has been completed on a dicing stage in a dicing process unit in a dicing device; and (b) a step of performing cutting to a scribe area from a first main surface by a dicing blade while supplying water or chemical solution containing water as a main component to the first main surface of the wafer on which a semiconductor device having electrodes containing aluminum as a main component is formed, wherein, in the step (b), an average illuminance of the first main surface is kept at not less than 70.

20. In the manufacturing method of a semiconductor device according to the item 19, process time of the step (b) is not less than 30 minutes.

An outline of still another invention disclosed in this application will be itemized as follows.

1. A manufacturing method of a semiconductor device includes: (a) a step of forming electrodes containing aluminum as a main component on a semiconductor wafer; and (b) a step of dicing the semiconductor wafer while supplying cooling water to the semiconductor wafer to divide the semiconductor wafer into respective chips, wherein, in the step (b), the semiconductor wafer is diced while irradiating light on an entire surface of an element forming surface of the semiconductor wafer so as to prevent the corrosion of the electrodes.

2. In the manufacturing method of a semiconductor device according to the item 1, a dicing device used in the step (b) dices the semiconductor wafer by using one pair of blades arranged in a direction crossing a cutting direction.

3. In the manufacturing method of a semiconductor device according to the item 2, illumination devices are arranged so that a light-shielded area is not formed on the element forming surface of the semiconductor wafer during the dicing of the semiconductor wafer.

4. In the manufacturing method of a semiconductor device according to the item 3, a cover which covers a process chamber for dicing the semiconductor wafer is provided in the dicing device, and the illumination devices are arranged inside the cover.

5. In the manufacturing method of a semiconductor device according to the item 3, a transparent cover which covers a process chamber for dicing the semiconductor wafer is provided in the dicing device, and the illumination devices are arranged outside the cover.

6. In the manufacturing method of a semiconductor device according to the item 3, a plurality of illumination devices are arranged in the dicing device.

7. In the manufacturing method of a semiconductor device according to the item 3, the illumination devices are arranged in the dicing device.

8. In the manufacturing method of a semiconductor device according to the item 1, the dicing device used in the step (b) dices the semiconductor wafer by using a pair of blades arranged in a cutting direction.

9. In the manufacturing method of a semiconductor device according to the item 8, the illumination devices are arranged so that a light-shielded area is not formed on the element forming surface of the semiconductor wafer during the dicing of the semiconductor wafer.

10. In the manufacturing method of a semiconductor device according to the item 9, a cover which covers a process chamber for dicing the semiconductor wafer is provided in the dicing device, and the illumination devices are arranged inside the cover.

11. In the manufacturing method of a semiconductor device according to the item 9, a plurality of illumination devices are arranged in the dicing device.

12. In the manufacturing method of a semiconductor device according to the item 1, in the step (b), light of not less than 70 lux and less than 2000 lux is irradiated on an entire surface of an element forming surface of the semiconductor wafer.

13. In the manufacturing method of a semiconductor device according to the item 12, in the step (b), light of not less than 100 lux and less than 200 lux is irradiated on an entire surface of an element forming surface of the semiconductor wafer.

14. In the manufacturing method of a semiconductor device according to the item 12, in the step (b), light of not less than 80 lux and less than 300 lux is irradiated on an entire surface of an element forming surface of the semiconductor wafer.

15. In the manufacturing method of a semiconductor device according to the item 12, in the step (b), light of not less than 70 lux and less than 500 lux is irradiated on an entire surface of an element forming surface of the semiconductor wafer.

16. In the manufacturing method of a semiconductor device according to the item 1, in the step (b), light of not less than 70 lux is irradiated on an entire surface of an element forming surface of the semiconductor wafer.

17. In the manufacturing method of a semiconductor device according to the item 16, in the step (b), light of not less than 80 lux is irradiated on the entire surface of the element forming surface of the semiconductor wafer.

18. In the manufacturing method of a semiconductor device according to the item 17, in the step (b), light of not less than 100 lux is irradiated on the entire surface of the element forming surface of the semiconductor wafer.

19. In the manufacturing method of a semiconductor device according to the item 1, the light irradiated in the step (b) has an energy larger than an energy of a bandgap of a semiconductor material.

20. In the manufacturing method of a semiconductor device according to the item 1, the light irradiated in the step (b) has a wavelength of not more than 1.1 µm.

BRIEF DESCRIPTIONS OF THE DRAWINGS

FIG. 8 is a diagram for describing a mechanism of corrosion of an electrode.

FIG. 9 is a table showing a reaction formula between silicon and water and a reaction formula representing ionization of aluminum.

FIG. 10 is a diagram showing a mechanism which can prevent corrosion of an electrode when light is irradiated.

BEST MODE FOR CARRYING OUT THE INVENTION

Prior to detailed description of the present invention, the meanings of terms used in this application will be described below.

A wafer indicates a silicon single-crystal substrate (having an almost planar-circular shape in general) used to manufacture integrated circuits, a sapphire substrate, a glass substrate, other insulating, semi-insulating or semiconductor substrate, or a composite substrate thereof. In this application, it is assumed that a semiconductor device includes not only those formed on a semiconductor or insulating substrate such as a silicon wafer or a sapphire substrate but also a TFT (Thin-Film-Transistor) and an STN (Super-Twisted-Nematic) liquid crystal formed on other insulating substrate such as glass, unless otherwise stated.

Dicing indicates a process for cutting a wafer on which a large number of semiconductor devices are formed to separate it into respective chips.

An illumination device indicates a device which emits light and includes a device which emits not only visible light but also light having a wavelength of 1.1 μm or less.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted.

Hereinafter, the embodiments of the present invention will be described in detail with reference to the drawings.

First Embodiment

Figure 1:
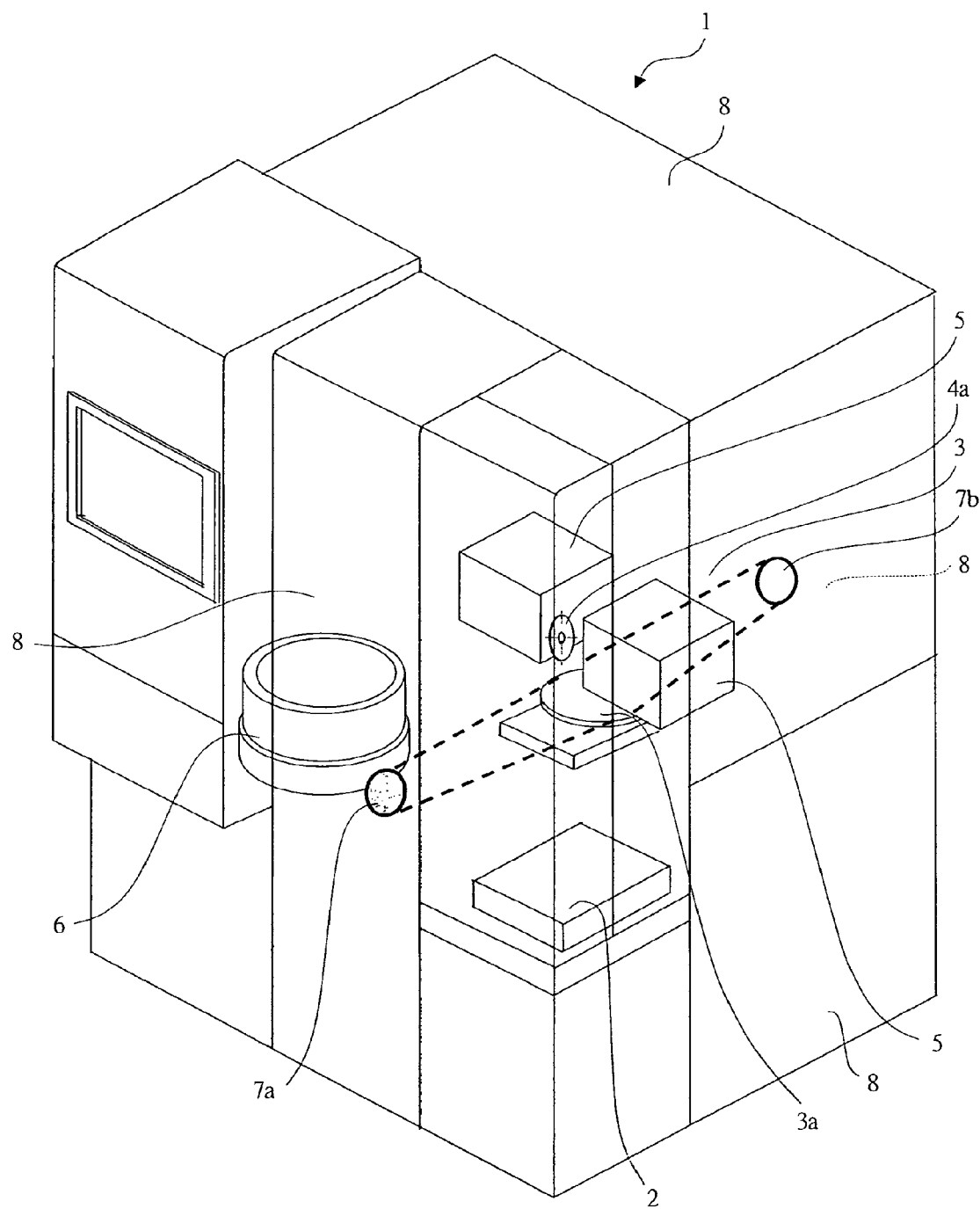
FIG. 1 is a diagram showing a dicing device according to a first embodiment.

FIG. 1 is a perspective view showing a dicing device 1 according to a first embodiment. In FIG. 1, the dicing device 1 according to the first embodiment has a wafer cassette chamber 2, a process chamber (dicing process unit) 3, a dicing stage 3a, a blade 4a, spindles 5, a cleaning stage 6, illumination devices 7a and 7b, and a cover 8.

The wafer cassette chamber 2 is provided to convey a cassette having wafers into/out of the dicing device 1. Also, the process chamber 3 is provided to dice a wafer and includes the dicing stage 3a, the blade 4a, and the spindle 5 arranged.

The dicing stage 3a serves as a stage on which a wafer is placed and diced.

The blade (first dicing blade) 4a is formed of a kind of cutting blade to which diamond particles are attached, and it can cut a wafer placed on the dicing stage 3a. Although not shown in FIG. 1, a blade (second dicing blade) 4b is provided on a side opposite to the blade 4a. More specifically, the blade 4a and the blade 4b are held so that side surfaces thereof are opposed to each other.

The spindles 5 are designed to rotate the blade 4a (and the blade 4b). The blade 4a is rotated at high speed by the spindle 5, thereby cutting a wafer. The spindle 5 is designed to adjust a position of the blade 4a.

The cleaning stage 6 is provided to clean up dusts such as silicon pieces adhering to the wafer by dicing.

The illumination devices 7a and 7b are arranged to irradiate light on an entire surface of an element forming surface (first main surface) of a wafer placed on the dicing stage 3a, and the light is irradiated on the entire surface of the element forming surface even during a dicing operation. That is, during the dicing operation, the light-shielded area is not formed on the wafer. A feature of one invention disclosed in this application is that dicing is performed while irradiating light on an entire surface of an element forming surface of a wafer. More specifically, by performing the dicing while irradiating light on the entire surface of the element forming surface of the wafer, it is possible to prevent the corrosion of bonding pads (electrodes) containing aluminum as a main component as described later.

In the cover 8 which covers the process chamber 3 of the dicing device 1, the illumination devices 7a and 7b are provided inside the cover 8 on the front side and inside the cover 8 on the rear side, respectively. As described above, the plurality of illumination devices 7a and 7b are arranged at different positions in the dicing device 1 so as not to form a light-shielded area on the wafer. When the cover 8 is composed of a transparent material, the illumination devices 7a and 7b can be provided outside the cover 8 instead of inside the cover 8. The cover 8 is made of, for example, a semi-transparent material (light-shielding rate of 50% or more) or a light-shielding material (light-shielding rate of 90% or more).

Illuminances of the illumination devices 7a and 7b are determined from a standpoint that the corrosion of the bonding pads during the dicing can be suppressed. For example, the illuminances of the illumination devices 7a and 7b are adjusted so that an average illuminance of light on the wafer placed on the dicing stage 3a is 70 lux or more. In this case, the average illuminance is obtained by averaging macroscopic illuminances on an element forming surface (first main surface) of the wafer by the entire element forming surface and processing time of a dicing process (process of cutting a wafer). The macroscopic illuminance is obtained by averaging illuminances in an area of, for example, an approximately 1-cm square, and it is different from a microscopic illuminance in a micron-order area. Also, during the dicing process, an illuminance is desirably kept at 70 lux or more at any positions on the element forming surface of the wafer. In other words, an illuminance which is equal to or higher than a minimum illuminance on the first main surface is desirably kept at any positions on the element forming surface of the wafer. In this case, the minimum illuminance on the first main surface means the minimum illuminance of illuminances obtained by averaging macroscopic illuminances on the element forming surface of the wafer by the process time of the dicing process.

When the average illuminance of light on the wafer is 70 lux or more, the corrosion of the bonding pads can be suppressed. On the other hand, although the average illuminance has no upper limit from a standpoint of the suppression of the corrosion of the bonding pads, the average illuminance is actually less than 2000 lux. In particular, when dicing is performed at an average illuminance of 80 lux or more and less than 1500 lux on the wave, the corrosion of the bonding pads can be suppressed. Furthermore, the average illuminance of light on the wafer is desirably 90 lux or more and less than 1300 from a standpoint of the suppression of the corrosion of the bonding pads, and the average illuminance of light on the wafer is more desirably 100 lux or more and less than 1200. More specifically, when the average illuminance of light on the wafer is 100 lux or more, the corrosion of the bonding pads can be effectively suppressed.

The lower limit of the average illuminance is necessary so as to suppress the corrosion of the bonding pads. However, any upper limit of the average illuminance does not give particular problem. For this reason, the average illuminance on the wafer may be 80 lux or more and less than 500 lux. Furthermore, the average illuminance on the wafer may be 90 lux or more and lower than 300 lux or 100 lux or more and less than 200 lux.

The light irradiated from the illumination devices 7a and 7b may be the light having a wavelength of less than 1.1 μm as described below. For example, it may be visible light. Therefore, the illumination devices 7a and 7b can be composed of, for example, fluorescent lamps or electric light bulbs. For this reason, it is not necessary to prepare special devices for the illumination devices 7a and 7b, and the cost reduction can be advantageously achieved.

Figure 2:
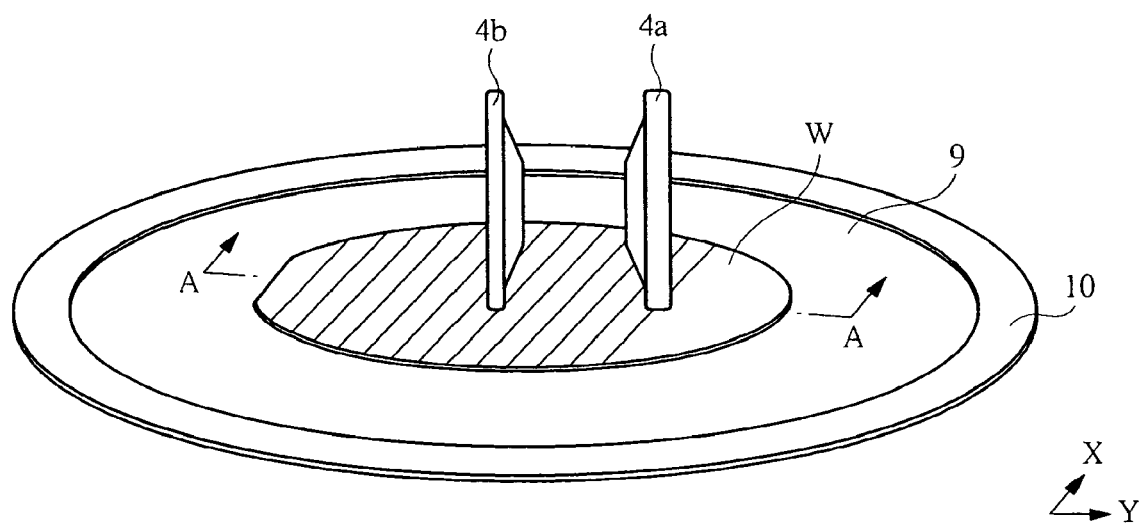
FIG. 2 is a diagram for describing a dicing operation of the dicing device according to the first embodiment.

The dicing device 1 according to the first embodiment has a structure as described above. Next, an operation of the dicing device 1 will be described below. FIG. 2 is a diagram showing an operation of dicing a wafer W by the dicing device 1 according to the first embodiment. In FIG. 2, after a frame 10 is attached to an adhesive dicing tape 9, the wafer W is adhered at the center of the dicing tape 9. At this time, the wafer W is adhered to the dicing tape 9 so that an element forming surface thereof is directed upward. Subsequently, the wafer W to which the dicing tape 9 is adhered is placed on the dicing stage 3a shown in FIG. 1. Then, the wafer W is diced by the blades 4a and 4b while spraying pure water or chemical solution containing water as a main component (not shown). At this time, light is irradiated on the entire surface of the element forming surface of the wafer W by the illumination devices 7a and 7b shown in FIG. 1.

Figure 3:
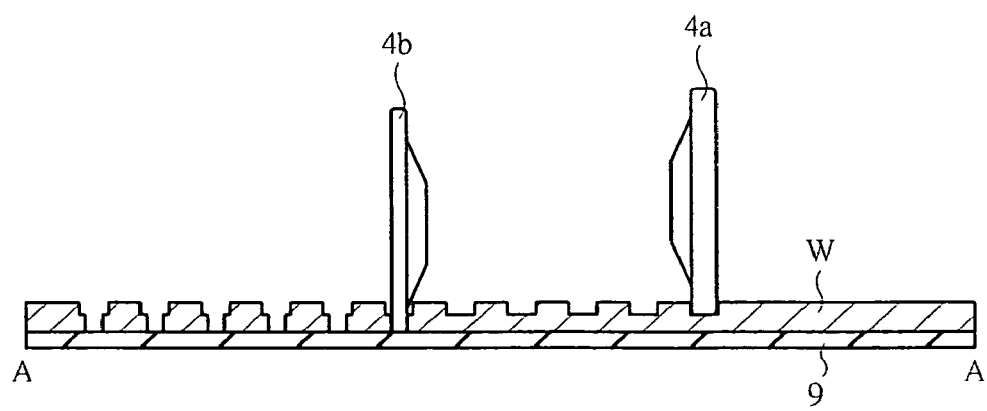
FIG. 3 is a partial sectional view taken along the line A-A in FIG. 2.

As shown in FIG. 2, the blades 4a and 4b are arranged in a direction (Y direction) crossing a cutting direction (X direction) of the wafer W, and the wafer W is diced by the pair of blades 4a and 4b. In other words, the wafer W is diced by the pair of blades 4a and 4b held so that side surfaces thereof are opposed to each other. A cross section taken along an A-A line in FIG. 2 is shown in FIG. 3. As shown in FIG. 3, a cutting edge of the blade 4a is thicker than a cutting edge of the blade 4b, and the wafer W is cut to a depth which is almost half the thickness of the wafer W by the blade 4a. Then, the wafer W is cut out by the blade 4b. As described above, it is understood that the wafer W is cut out by the pair of blades 4a and 4b. In other words, a scribe area is cut in two steps from the element forming surface side by the pair of blades 4a and 4b while supplying water or chemical solution containing water as a main component onto the element forming surface of the wafer W. In this example, the wafer W is completely cut out by the pair of blades 4a and 4b. However, the embodiment is not limited to this example, and the wafer W may be almost completely cut out or may be cut so as to leave a half or more part thereof.

Figure 4:
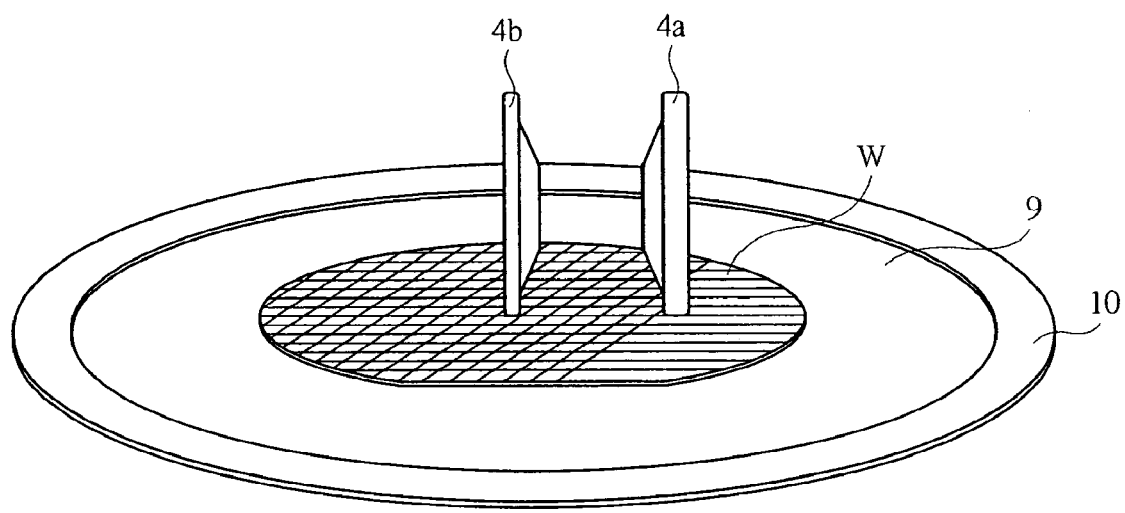
FIG. 4 is a diagram for describing a dicing operation of the dicing device according to the first embodiment.
Figure 5:
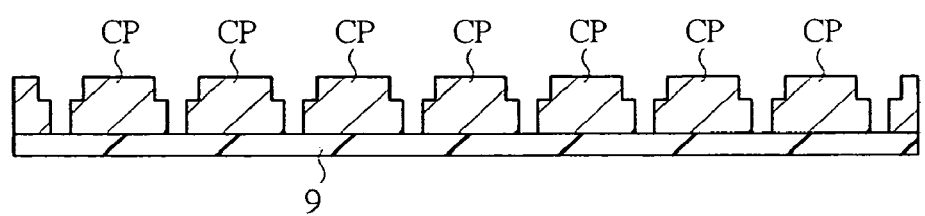
FIG. 5 is a sectional view showing a state in which a wafer is diced and cut into respective chips.

Subsequently, as shown in FIG. 4, after the wafer W is rotated by 90°, the wafer W is diced in the same manner as described above. By this means, as shown in FIG. 5, the wafer W can be divided into respective chips CP. Cutting time for dividing the wafer W into the respective chips CP is not specified, but this embodiment is effectively applied to that case of 20 minutes or more, in particular, 30 minutes or more. In other words, as the cutting time becomes long, aluminum easily dissolves from the bonding pads formed on the element forming surface of the wafer W. Therefore, when the cutting time of the wafer W is 30 minutes or more, the corrosion of the aluminum can be suppressed by irradiating the light onto the entire surface of the element forming surface of the wafer W by the illumination devices 7a and 7b shown in FIG. 1. Furthermore, when the cutting time is 40 minutes or more, light must be irradiated by the illumination devices 7a and 7b.

Figure 6:
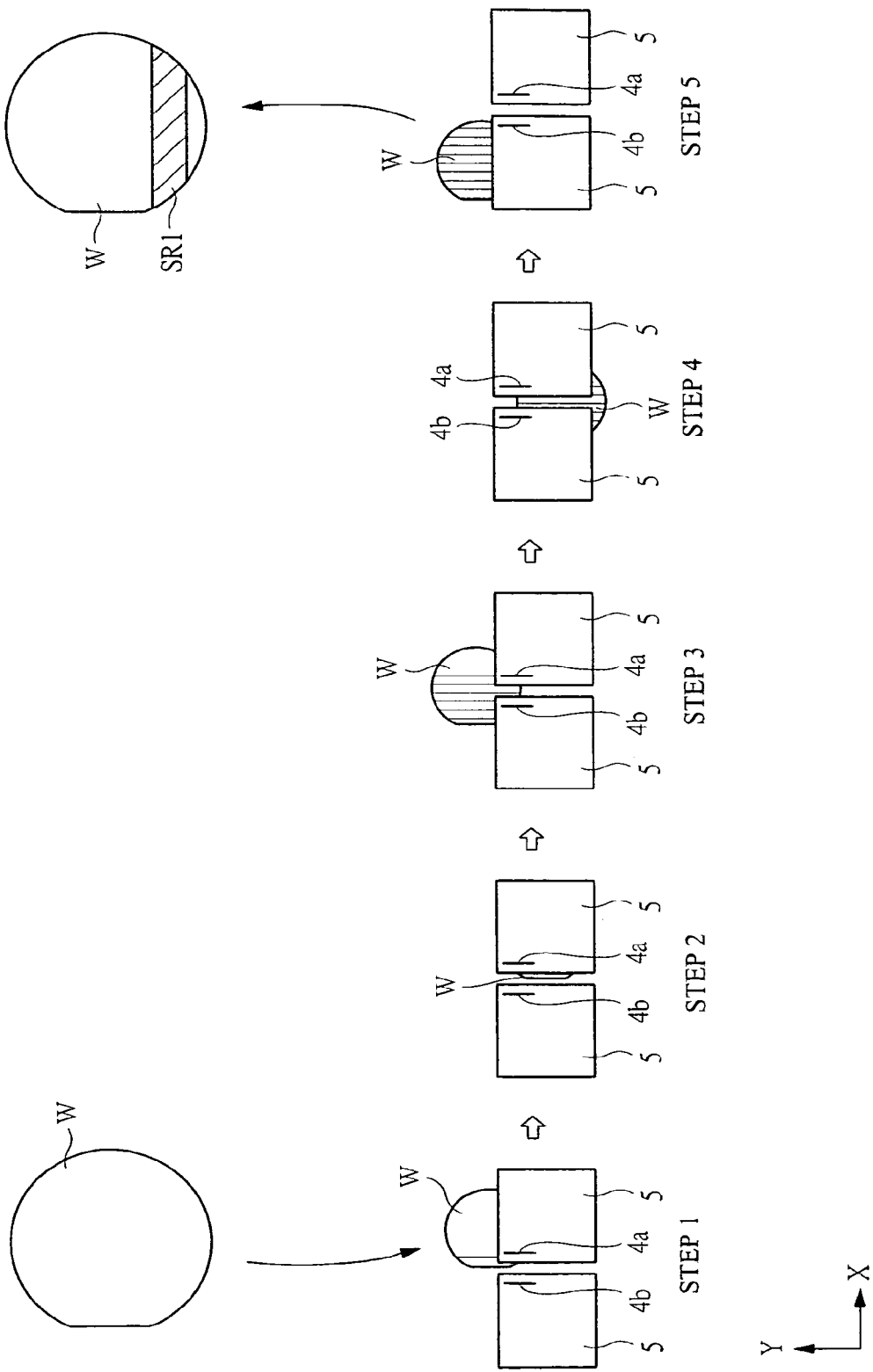
FIG. 6 is a diagram showing movement of a wafer during dicing.

Next, the movement of the wafer W during dicing will be described below with reference to FIG. 6 and FIG. 7. FIG. 6 is a diagram showing the dicing of the wafer W using the pair of blades 4a and 4b from above. As shown in FIG. 6, the wafer W is placed so that an orientation flat thereof is set on the left side (parallel to a Y-axis direction). First, as shown in step 1, the wafer W is diced by moving the wafer W from the upper side to the lower side in the Y-axis direction. At this time, the wafer W moves behind the spindle 5 connected to the blade 4a. In step 2, the water W is almost completely behind the spindle 5 on the right. Subsequently, after the wafer W is slightly moved to the left to change lines to be diced, as shown in step 3, the wafer W is diced by moving the wafer W from the lower side to the upper side in the Y-axis direction. At this time, although the wafer W is gradually exposed from the spindle 5 on the right, the entire surface of the wafer W is not exposed.

After the wafer W is slightly moved to the left (negative direction of the X axis) to change lines to be diced, as shown in step 4, the wafer W is diced by moving the wafer W from the upper side to the lower side along the Y axis. At this time, a most part of the wafer W is behind the spindles 5 on the left and right sides. Subsequently, after the wafer W is slightly moved to the left (negative direction of the X axis) to change lines to be diced, as shown in step 5, the wafer W is diced by moving the wafer W from the lower side to the upper side along the Y axis. At this time, although the wafer W is gradually exposed from the spindle 5 on the left, the entire surface of the wafer W is not exposed. By repeating the operation described above, the dicing in one direction is completed. However, during the dicing operation as described above, the wafer W moves so as to change a relative positional relationship between the wafer W and the spindle 5. However, the wafer W does not completely exposed from the spindle 5. Therefore, as shown in FIG. 6, it is understood that an area SR1 which is not exposed from the spindle 5 is present on the wafer W. The area SR1 serves as a light-shielded area because the area SR1 is not exposed from the spindle 5 in dicing. More specifically, when the illumination devices 7a and 7b are arranged as in the dicing device 1 according to the first embodiment, light is irradiated even on an area which is behind the spindle 5. For this reason the area SR1 does not become a light-shielded area. However, in a conventional dicing device in which the illumination devices 7a and 7b are not arranged, the area SR1 becomes a light-shielded area.

Figure 7:
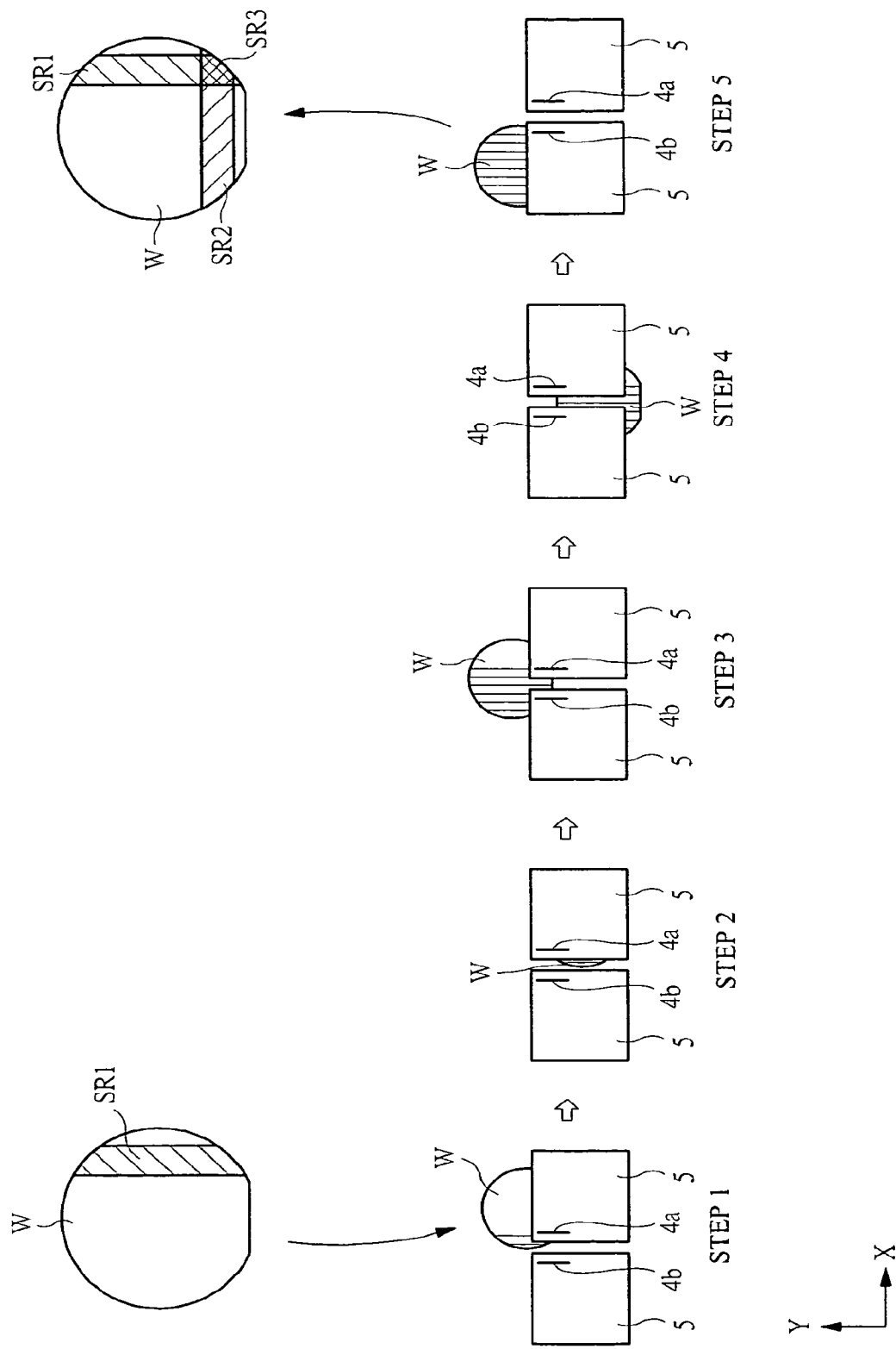
FIG. 7 is a diagram showing movement of a wafer during dicing.

Subsequently, as shown in FIG. 7, the dicing is performed after the wafer W is rotated by 90°. More specifically, the wafer W is diced in a state where the orientation flat of the wafer W is parallel to the X axis. Also in this case, operations in step 1 to step 5 in FIG. 7 are performed in the same manner as that described in FIG. 6. However, also in the case in FIG. 7, an area SR2 which is not exposed from the spindle 5 is present on the wafer W. As described above, in the conventional dicing device which does not have the illumination devices 7a and 7b, the area SR1 and the area SR2 to be the light-shielded areas are present on the wafer. In particular, an overlapping area SR3 between the area SR1 and the area SR2 does not receive light because the area SR3 is behind the spindle 5 in both the cases of dicing in two directions perpendicular to each other.

A phenomenon where a bonding pad is corroded in the areas SR1 and SR2 serving as light-shielded areas occurs in the conventional dicing device. In particular, in the area SR3, the degree of corrosion is conspicuous. A mechanism which corrodes a bonding pad will be described below.

FIG. 8 is a sectional view showing a periphery of a bonding pad (electrode) 11 in the wafer W during dicing. As shown in FIG. 8, the bonding pad 11 made of, for example, aluminum is exposed from a surface protecting film 12 made of, for example, a silicon nitride film. Pure water 13 used in a dicing step flows on the bonding pad 11. Also, a silicon piece 14 generated by dicing the wafer W adheres to the bonding pad 11. It is assumed that the bonding pad 11 is formed in the area SR3 serving as a light-shielded area, and light-shielding member 15 which shields light L is, for example, the spindle 5 shown in FIG. 6 and FIG. 7.

In this case, when the silicon piece 14 is adhered onto the bonding pad 11, electrons move from aluminum constituting the bonding pad 11 to silicon constituting the silicon piece 14. In this manner, aluminum dissolves into the pure water as cations. Therefore, the bonding pad 11 is corroded. A mechanism which dissolves aluminum can be understood as follows. FIG. 9 shows a chemical reaction (1) between silicon and pure water and a chemical reaction (2) expressing ionization of aluminum.

General interpretation of corrosion which occurs when two types of materials are brought into contact with each other in a solution is that electrons move from a material having a low oxidation-reduction potential to a material having a high oxidation-reduction potential, and the material having the low oxidation-reduction potential dissolves into the solution cations. As is apparent from FIG. 9, an oxidation-reduction potential of the chemical reaction (1) of silicon is −0.86 V. On the other hand, the oxidation-reduction potential of the chemical reaction (2) of aluminum is −1.66 V. Therefore, since the oxidation-reduction potential of aluminum is lower than the oxidation-reduction potential of silicon, electrons are emitted from aluminum to silicon. For this reason, it is understood that aluminum emits electrons to be cations and dissolves in pure water.

As described above, in the areas SR1 and SR2 which are shielded from light, in particular, the area SR3 which is completely shielded from light, the bonding pad 11 is corroded according to the mechanism above.

Therefore, in the first embodiment, the illumination devices 7a and 7b are provided in the dicing device 1 so as to irradiate light onto the entire surface of the element forming surface of the wafer W, thereby preventing a light-shielded area from being formed on the wafer. A mechanism which prevents the corrosion of a bonding pad when light is irradiated on the wafer W will be described below.

FIG. 10 is a sectional view showing a periphery of the bonding pad 11 in the wafer W during dicing. FIG. 10 is almost the same as FIG. 8, but is different from FIG. 8 in that light L is irradiated on an area for forming the bonding pad 11. In FIG. 10, when the light L is irradiated on the bonding pad 11 which is in contact with the silicon piece 14, electrons are not emitted from aluminum constituting the bonding pad 11 to silicon constituting the silicon piece 14. On the contrary, electrons are emitted from silicon to aluminum. Therefore, since aluminum does not emit electrons, aluminum does not dissolve into the pure water as cations, and the corrosion of the bonding pad 11 can be suppressed.

Figure 11:
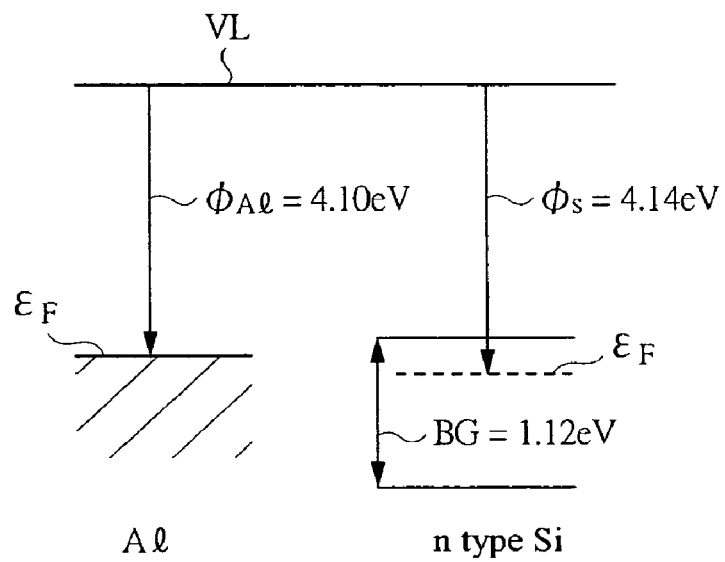
FIG. 11 is a diagram showing a band structure between aluminum and silicon.

As described above, the mechanism which emits electrons from silicon to aluminum can be understood as follows. FIG. 11 shows independent band structures of silicon doped with an n type impurity such as phosphorous or arsenic and aluminum. Aluminum has a Fermi potential CF from a vacuum level VL to an energy level of 4.10 eV. More specifically, a work function $\phi_{Al}$ of aluminum is 4.10 eV On the other hand, n type silicon in which a predetermined amount of n type impurity (for example, $1 \times 10^{18}$ atoms/cm$^3$) is doped has a Fermi potential $\epsilon_F$ from a vacuum level to an energy level of 4.14 eV, and a work function $\phi_s$ thereof is =4.14 eV. Also, an energy of a bandgap between a valence band and a conduction band of silicon is 1.12 eV.

Figure 12:
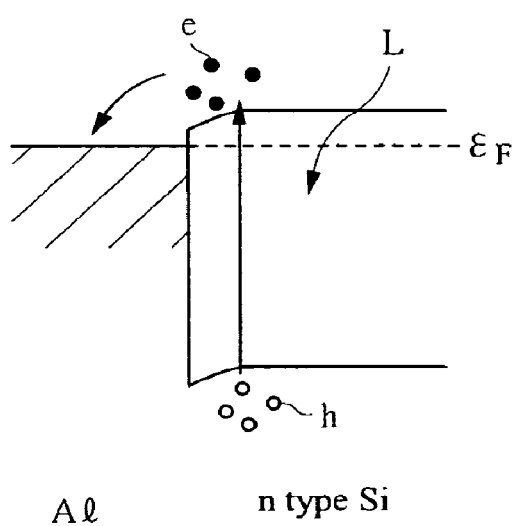
FIG. 12 is a diagram showing a band structure obtained when aluminum and silicon are brought into contact with each other and a diagram for describing that electrons move from silicon to aluminum.

When the aluminum and the n type silicon each having the band structure described above are brought into contact with each other, the band structure is changed into a band structure shown in FIG. 12. More specifically, the band is curved so that the Fermi potential $\epsilon_F$ of the aluminum matches the Fermi potential $\epsilon_F$ of the n type silicon. At this time, as shown in FIG. 12, the Fermi potential $\epsilon_F$ of the aluminum is lower than the energy level of the conduction band of the silicon.

In this case, when light having an energy which is equal to or larger than the bandgap of the silicon is incident on the silicon, electrons in the valence band are excited to the conduction band by a photoelectric effect to generate one pair of hole and electron. The electrons excited to the valence band move to aluminum having a lower energy level. Therefore, electrons are emitted from the n type silicon to the aluminum and the ionization of the aluminum can be suppressed. Accordingly, it is understood that the corrosion of the bonding pad can be suppressed.

For this reason, in the first embodiment, dicing is performed while irradiating light on the entire surface of the element forming surface of the wafer W. By this means, it is possible to suppress the corrosion of a bonding pad made of aluminum.

If the light can generate only one pair of hole and electron by a photoelectric effect, it can be used as light to be irradiated on the element forming surface of the wafer W. Therefore, the light is required to have an energy which is equal to or larger than the bandgap of silicon. Accordingly, light having a wavelength of, for example, 1.1 μm or less can be used. When a semiconductor material other than silicon is used, light having an energy which is equal to or larger than the bandgap of the semiconductor material can be used.

Further, if an average illuminance of light on the element forming surface of the wafer W is approximately 70 lux or more, an effect which prevents the corrosion of the bonding pad 11 can be achieved. In particular, from a standpoint to effectively suppress the corrosion of the bonding pad 11, when the average illuminance of light is set at 80 lux or more or 100 lux or more, a conspicuous effect can be obtained. From a standpoint to prevent the corrosion of the bonding pad, an upper limit of the illuminance of light irradiated on the element forming surface of the wafer W is not specified, but the illuminance is actually less than 2000 lux. Furthermore, from a standpoint to reduce a power consumption of the dicing device 1 to reduce the manufacturing cost, the average illuminance is desirably set to a minimum limit at which the effect can be obtained, and the average illuminance is desirably set at less than 1500 lux or less than 1300 lux, furthermore, less than 1200 lux. In addition, even though the average illuminance is less than 500 lux, less than 300 lux, or less than 200 lux, an effect of preventing the corrosion of the bonding pad can be obtained.

In the first embodiment, the example in which the bonding pad 11 is formed of aluminum is shown. However, the first embodiment is not limited to this example, and it is effectively applied to the case where a material containing aluminum as a main component such as silicon-aluminum (AlSi) and aluminum-copper-silicon (AlCuSi) is used.

Figure 13:
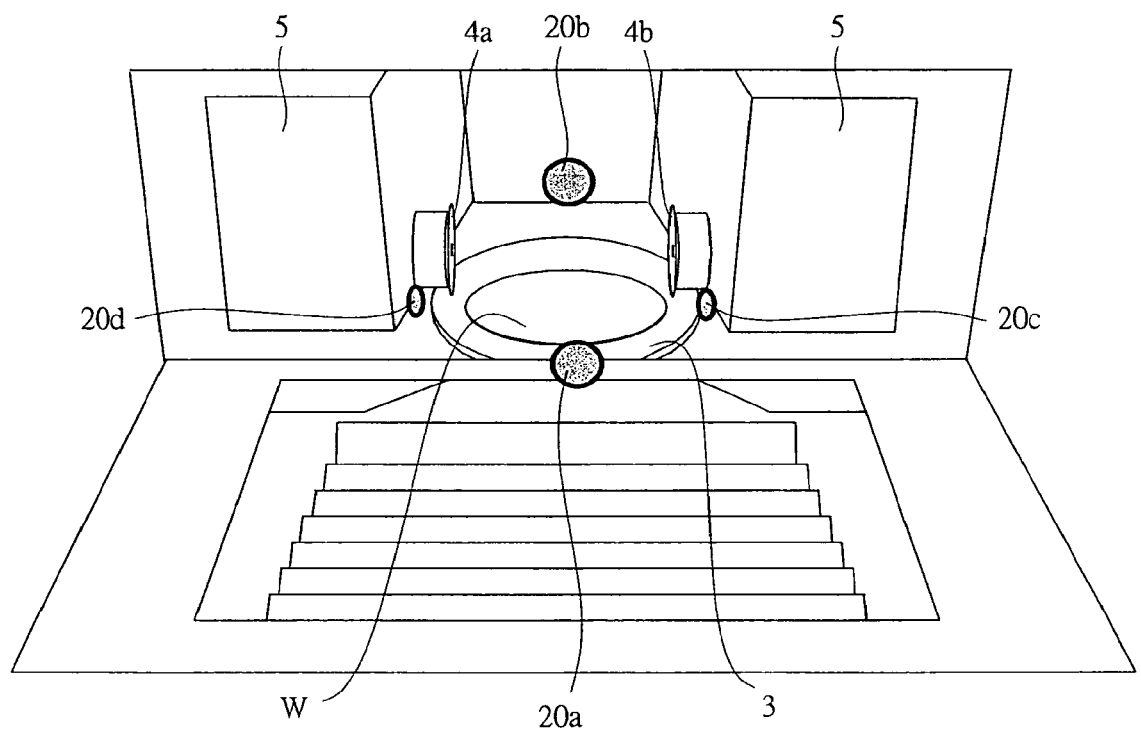
FIG. 13 is a diagram showing a modification example of the first embodiment.
Figure 20:
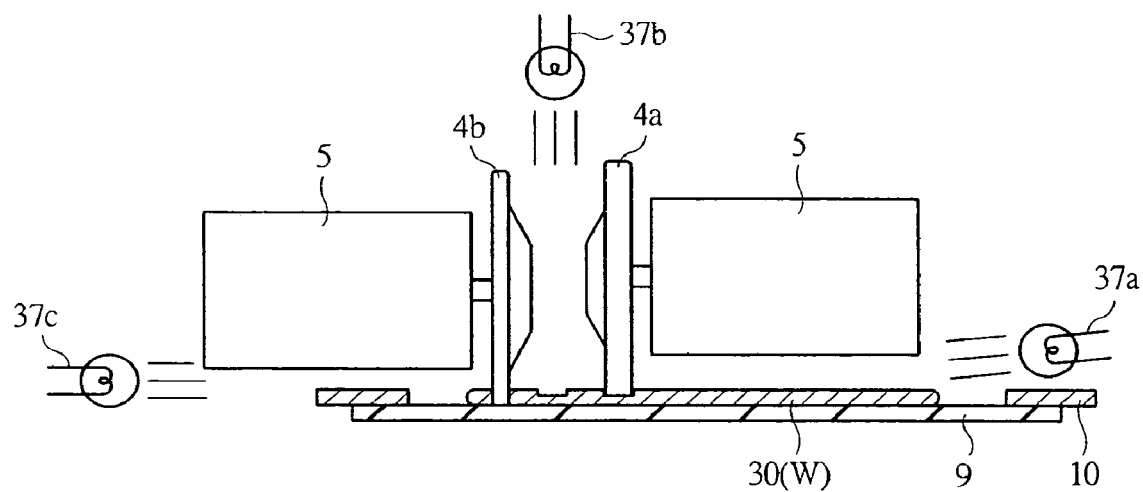
FIG. 20 is a sectional view showing a manufacturing process of a semiconductor device subsequent to FIG. 19, and is a diagram showing a step of dicing a wafer while irradiating light.

Further, in the first embodiment, the example in which the illumination devices 7a and 7b are attached to the cover 8 as shown in FIG. 1 has been described. However, the arrangement of illumination devices is not limited to this. For example, it is also possible to provide a plurality of illumination devices 20a to 20d in the dicing device 1 as shown in FIG. 13. Alternatively, it is possible to provide a plurality of illumination devices 37a to 37c in the dicing device 1 as shown in FIG. 20.

FIG. 13 is an enlarged diagram of a periphery of the dicing stage 3a. In FIG. 13, the illumination devices 20a to 20d are arranged so as to surround the periphery of the dicing stage 3a on which the wafer W is placed. Therefore, in the dicing process, even though an area which is behind the spindle 5 is present on the wafer W, light can be easily irradiated on the area. More specifically, since the plurality of illumination devices 20a to 20d are arranged near the wafer W, light can be easily irradiated on the entire surface of the element forming surface of the wafer W.

A manufacturing method of a semiconductor device using the dicing device according to the first embodiment will be described below. In the first embodiment, the description will be made with using a diode as an example of a semiconductor device.

Figure 14:
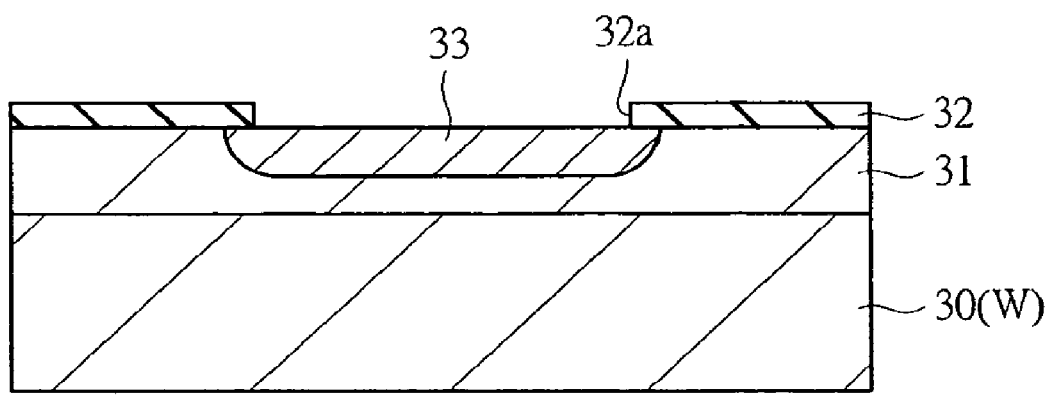
FIG. 14 is a sectional view showing a manufacturing process of a semiconductor device according to the first embodiment.

First, as shown in FIG. 14, a wafer 30 made of silicon in which an n type impurity such as antimony (Sb) is doped in high concentration is prepared. The concentration of the n type impurity doped in the wafer 30 is, for example, about $1 \times 10^{19}$ atoms/cm$^3$ to $1 \times 10^{20}$ atoms/cm$^3$.

Next, a silicon layer doped with an n type impurity such as phosphorous (P) is epitaxially grown on a main surface (element forming surface) of the wafer 30 to form an epitaxial layer 31. The concentration of the n type impurity doped in the epitaxial layer 31 is, for example, about $1 \times 10^{16}$ atoms/cm$^3$ to $1 \times 10^{19}$ atoms/cm$^3$.

Subsequently, thermal treatment is applied to the wafer 30 to form a silicon oxide film 32 on the epitaxial layer 31. Then, after a photoresist film (not shown) is formed on the silicon oxide film 32, the photoresist is subjected to the exposure and development to pattern the photoresist film. The photoresist is patterned so as to open an area in which a p type semiconductor region is formed.

Next, the silicon oxide film 32 is etched with using the patterned photoresist film as a mask to selectively form an opening 32a for forming a p type semiconductor region. Then, after the photoresist film is removed, for example, a PBF (Poly Boron Film) is formed on the epitaxial layer 31 including the opening 32a.

Subsequently, the wafer 30 is annealed in an atmosphere at about 900° C. to diffuse boron (B) in the PBF into the epitaxial layer 31 serving as an n type semiconductor region, thereby forming a p type semiconductor region 33. Thereafter, thermal treatment is applied to the wafer 30 at about 1000° C. in a nitrogen ($N_2$) atmosphere to form a p-n junction on a boundary between the epitaxial layer 31 and the p type semiconductor region 33. In this manner, a diode element can be formed.

Figure 15:
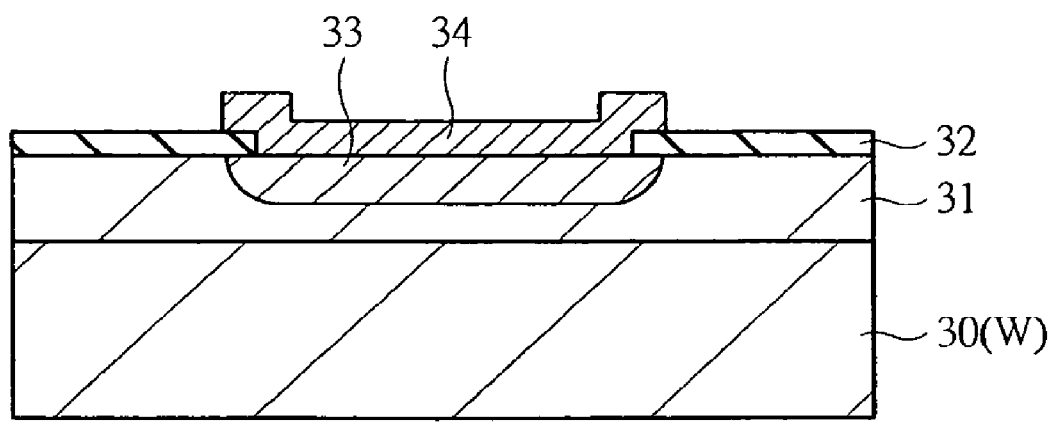
FIG. 15 is a sectional view showing a manufacturing process of a semiconductor device subsequent to FIG. 14.

Next, as shown in FIG. 15, a film made of aluminum (A) and silicon (Si) is formed on a main surface of the wafer 30 by sputtering. The, through a photolithography process and an etching process, the film made of aluminum and silicon is patterned to form an electrode 34.

Figure 16:
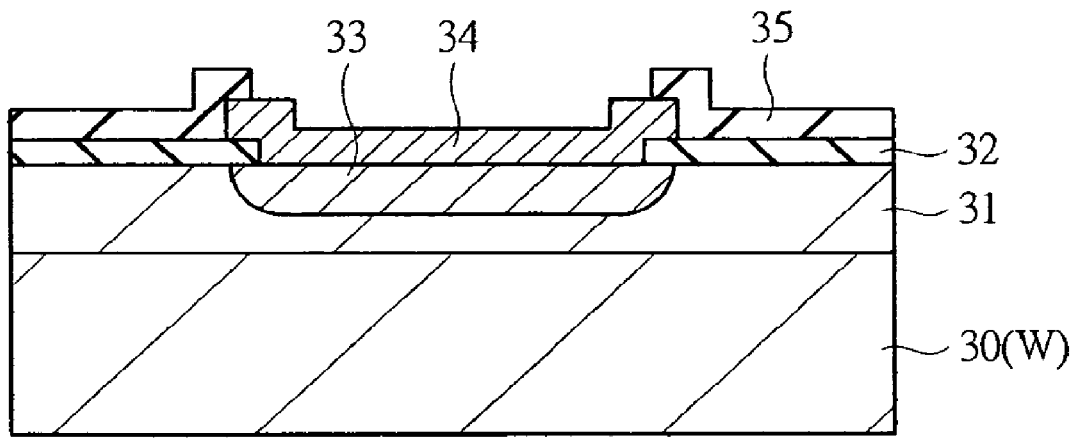
FIG. 16 is a sectional view showing a manufacturing process of a semiconductor device subsequent to FIG. 15.

Subsequently, as shown in FIG. 16, a silicon nitride film is formed on a main surface of the wafer 30 by CVD, thereby forming a surface protecting film 35 made of a silicon nitride film. Thereafter, the surface protecting film 35 is patterned through a photolithography process and an etching process. The surface protecting film 35 is patterned so as to expose a front surface of the electrode 34.

Figure 17:
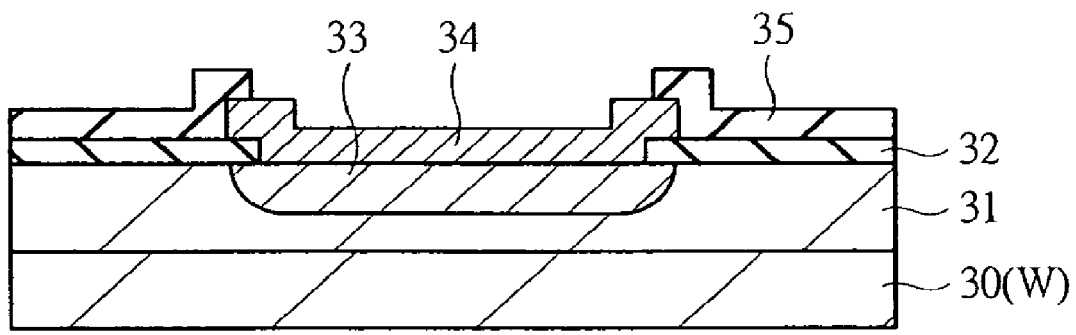
FIG. 17 is a sectional view showing a manufacturing process of a semiconductor device subsequent to FIG. 16.
Figure 18:
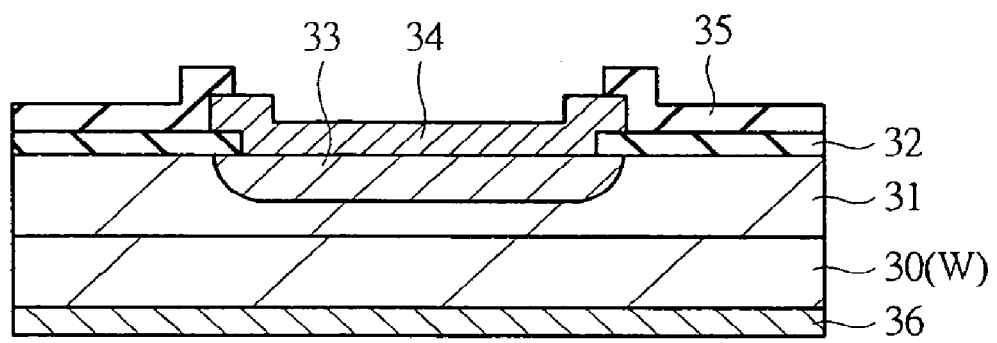
FIG. 18 is a sectional view showing a manufacturing process of a semiconductor device subsequent to FIG. 17.

Next, as shown in FIG. 17, a rear surface of the wafer 30 is polished to reduce the thickness of the wafer 30. Subsequently, after the wafer 30 is cleaned, a rear-surface electrode 36 made of, for example, a gold (Au) film is formed on a rear surface of the wafer 30 by, for example, a deposition method as shown in FIG. 18. In this manner, a plurality of diodes can be formed on the wafer 30.

Figure 19:
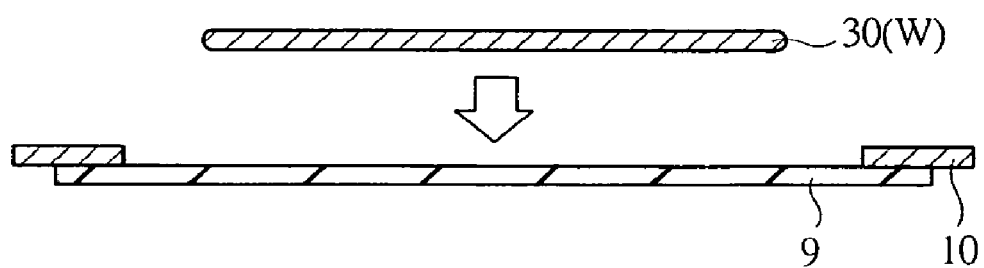
FIG. 19 is a sectional view showing a manufacturing process of a semiconductor device subsequent to FIG. 18, and a diagram showing a step of attaching a wafer to a dicing tape.

Next, as shown in FIG. 19, the wafer 30 on which the plurality of diodes are formed is disposed at a center portion of the frame 10 to which the dicing tape 9 is adhered. At this time, the wafer 30 is adhered to the adhesive dicing tape 9.

Subsequently, as shown in FIG. 20, the wafer 30 is diced. More specifically, the wafer is brought into contact with the blades 4a and 4b which are attached to the spindles 5 and rotated at a high speed and the wafer 30 is cut into respective chips. At this time, cooling water (not shown) is sprayed to contact portions between the blades 4a and 4b and the wafer 30.

During the dicing of the wafer 30, as shown in FIG. 20, light is irradiated on the wafer 30 by, for example, the illumination devices 37a to 37c. Therefore, even though a silicon piece generated by the dicing adheres to the electrode (bonding pad) 34 formed on the wafer, the corrosion of the electrode 34 due to the silicon piece can be prevented. More specifically, in general, during the dicing of the wafer 30, a light-shielded area is formed on the wafer 30 due to the spindle 5 or the like, and when the silicon piece adheres to the electrode 34 in the light-shielded area, the electrode is corroded by Galvanic corrosion. However, in the first embodiment, by providing the illumination devices 37a to 37c, light is irradiated also onto the area on which a light-shielded part is formed by the spindle 5 or the like. In other words, in the dicing process, since light is irradiated on the entire surface of the element forming surface of the wafer 30, a light-shielded area is not formed. For this reason, even though a silicon piece adheres to the electrode 34 containing aluminum as a main component, the corrosion of the electrode 34 can be prevented.

In the dicing device 1 according to the first embodiment, as shown in FIG. 1, light is irradiated by the illumination devices 7a and 7b. In FIG. 20, in order to clearly show that light is irradiated on the entire surface of the element forming surface of the wafer W, the case where the illumination devices 37a to 37c are disposed has been described. Therefore, even though the illumination devices 7a and 7b are arranged as shown in FIG. 1, light can be irradiated on the entire surface of the element forming surface of the wafer W as a matter of course.

Figure 21:
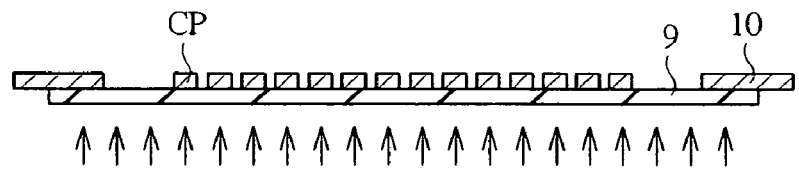
FIG. 21 is a sectional view showing a manufacturing process of a semiconductor device subsequent to FIG. 20.

Next, as shown in FIG. 21, after the wafer 30 is separated by dicing into respective chips CP, an ultraviolet ray is irradiated from a lower surface of the dicing tape 9 (surface to which the wafer 30 is not adhered). By this means, the adhesion of the dicing tape 9 is deteriorated and the chip CP can be easily picked up.

Figure 22:
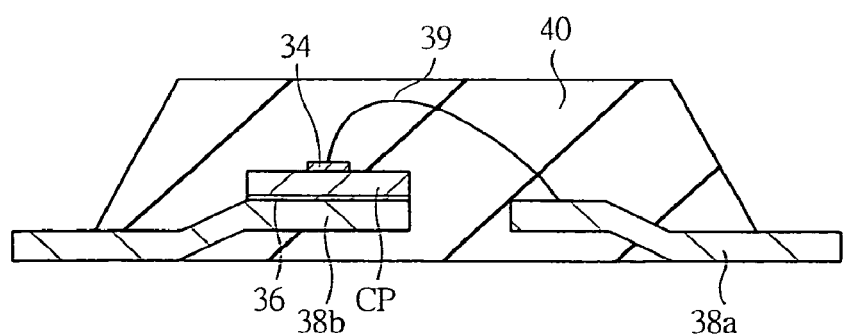
FIG. 22 is a sectional view showing a manufacturing process of a semiconductor device subsequent to FIG. 21.

Subsequently, after the chip is picked up, as shown in FIG. 22, the rear-surface electrode 36 of the chip CP is connected onto a lead 38b of a pair of leads 38a and 38b. Then, the electrode 34 formed on the chips CP is connected to the other lead 38a by using a metal wire (wire) 39.

Next, the internal end portions of the leads 38a and 38b, the chip CP, and the metal wire 39 are sealed by resin 40, thereby forming a diode package. As described above, in the manufacturing method of a semiconductor device according to the first embodiment, since the illumination devices 37a to 37c are provided in the dicing device 1 to irradiate light on the entire surface of the element forming surface of the wafer 30 during dicing, the corrosion of the electrode 34 due to the contact between the silicon piece and the electrode 34 can be prevented. Therefore, it is possible to prevent the manufacturing of a defective product in which the electrode 34 is corroded or eliminated, and a production yield can be increased.

Second Embodiment

In the first embodiment, dicing of one invention disclosed in this application has been described based on an example of a manufacturing method of a diode. However, in a second embodiment, dicing of one invention disclosed in this application will be described below based on an example of a manufacturing method of a bipolar transistor.

Figure 23:
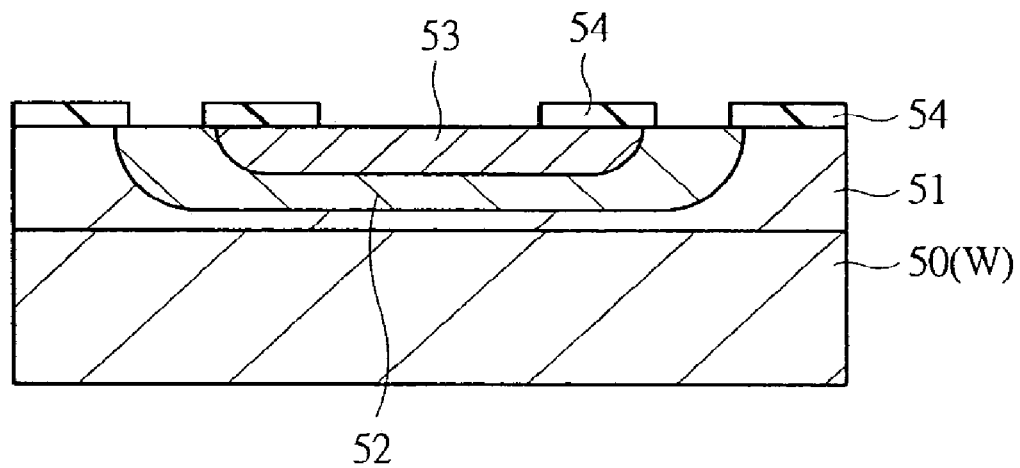
FIG. 23 is a sectional view showing a manufacturing process of a semiconductor device according to a second embodiment.

First, as shown in FIG. 23, a wafer 50 in which a p type impurity such as boron (B) is doped is prepared. Then, an epitaxial layer 51 in which a p type impurity such as boron is doped is formed on a main surface (element forming surface) of the wafer 50. The epitaxial layer 51 can be formed by using, for example, an epitaxial growth method.

Subsequently, an n type semiconductor region 52 is formed in the epitaxial layer 51. The n type semiconductor region 52 can be formed through a photolithography process and an ion-implantation process. More specifically, the photoresist is patterned by the photolithography, and an n type impurity such as phosphorous or arsenic is doped in the wafer 30 with using the patterned photoresist film as a mask, thereby forming the n type semiconductor region 52.

Next, a p type semiconductor region 53 is formed in the n type semiconductor region 52. The p type semiconductor region 53 can be formed through a photolithography process and an ion implantation process. By forming the epitaxial layer 51, the n type semiconductor region 52, and the p type semiconductor region 53 in this manner, a pnp structure can be formed.

Subsequently, a silicon oxide film 54 is formed on a main surface of the wafer 50. Then, through a photolithography process and an etching process, the silicon oxide film 54 is patterned. The silicon oxide film 54 is patterned so as to open an electrode forming area.

Figure 24:
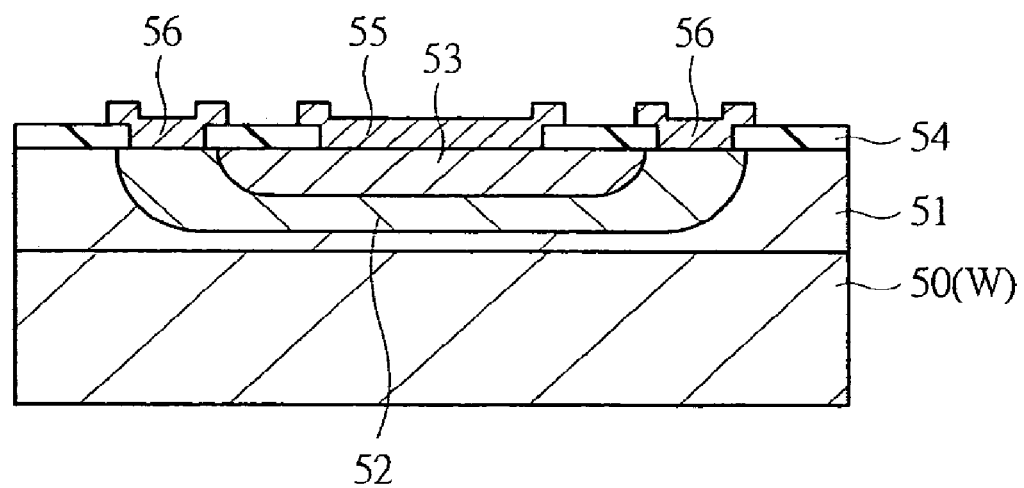
FIG. 24 is a sectional view showing a manufacturing process of a semiconductor device subsequent to FIG. 23.

Next, a film made of aluminum and silicon is formed on the wafer 50 by sputtering. Then, as shown in FIG. 24, the film made of aluminum and silicon is patterned through a photolithography process and an etching process, thereby forming an emitter electrode 55 and a base electrode 56.

Figure 25:
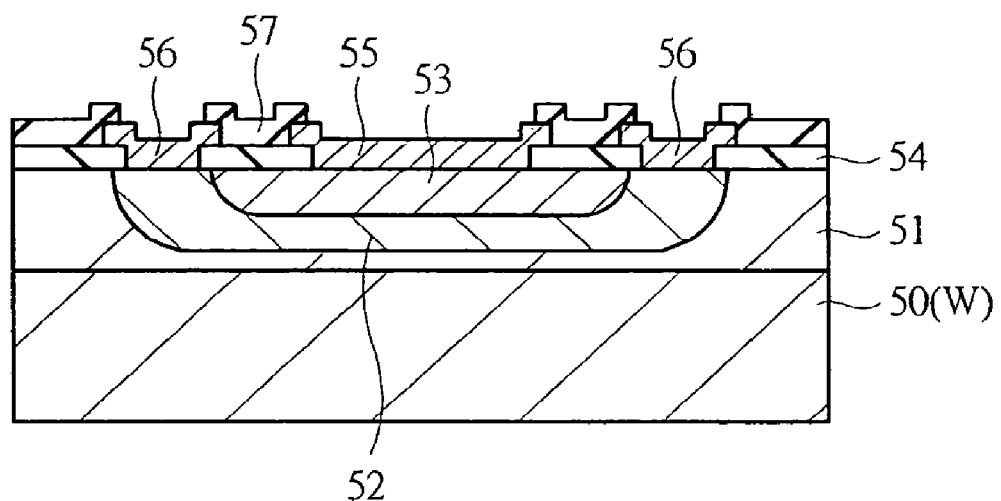
FIG. 25 is a sectional view showing a manufacturing process of a semiconductor device subsequent to FIG. 24.

Subsequently, a silicon nitride is formed on the wafer 50 by CVD, thereby forming a surface protecting film 57 formed of the silicon nitride film. Then, as shown in FIG. 25, the surface protecting film 57 is patterned through a photolithography process and an etching process. The surface protecting film 57 is patterned so as to expose the emitter electrode 55 and the base electrode 56.

Figure 26:
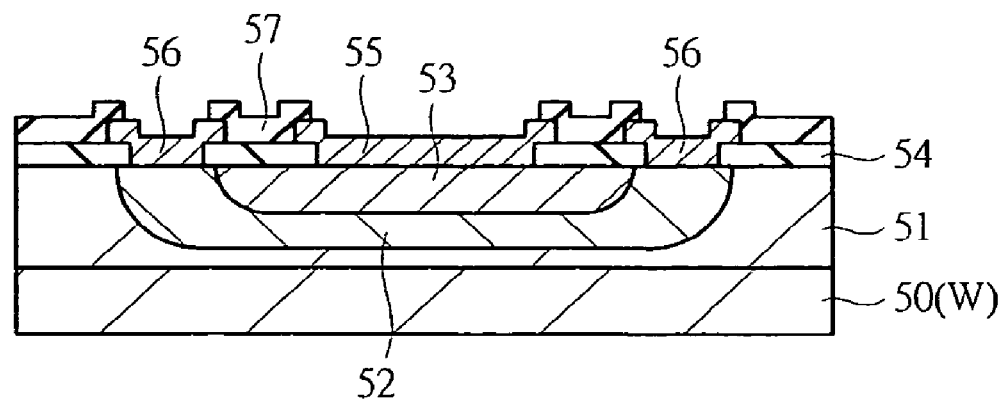
FIG. 26 is a sectional view showing a manufacturing process of a semiconductor device subsequent to FIG. 25.
Figure 27:
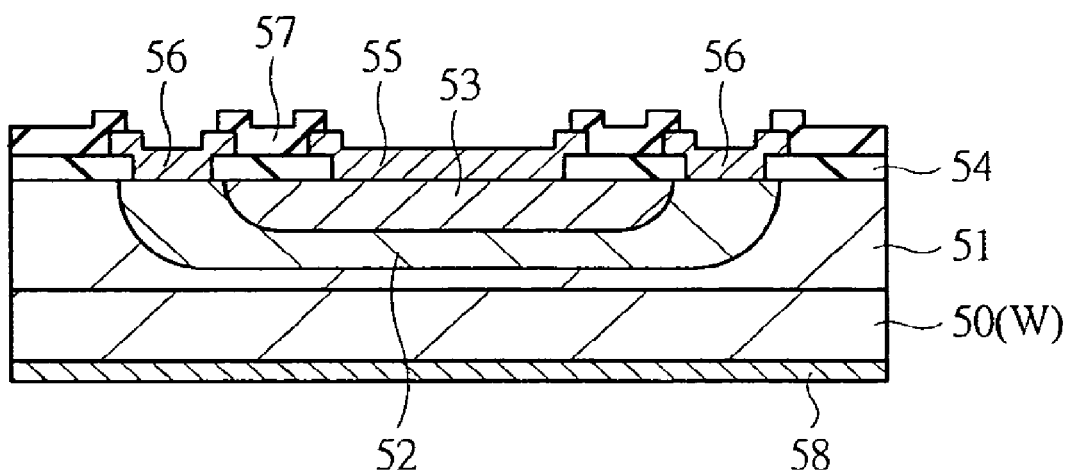
FIG. 27 is a sectional view showing a manufacturing process of a semiconductor device subsequent to FIG. 26.

Next, as shown in FIG. 26, the rear surface of the wafer 50 is polished to reduce the thickness of the wafer 50. Then, after the wafer 50 is cleaned, a rear-surface electrode 58 made of, for example, a gold (Au) film is formed on the rear surface of the wafer 50 by, for example, an deposition method as shown in FIG. 27. In this manner, a plurality of bipolar transistors can be formed on the wafer 50.

Subsequently, the wafer 50 on which the plurality of bipolar transistors are formed is diced. The dicing is performed through the same process as that in FIG. 19 to FIG. 21 described in the first embodiment. More specifically, as shown in FIG. 19, after the dicing tape 9 is adhered on the rear surface of the wafer 50 (described as the wafer 30 in FIG. 19 to FIG. 21), as shown in FIG. 20, the wafer 50 is cut into respective chips CP while irradiating light on the entire surface of the element forming surface of the wafer 50. By this means, since a light-shielded area is not formed on the wafer 50 in the dicing process, the corrosion of the emitter electrode 55 and the base electrode 56 due to the adhesion of silicon pieces can be prevented.

Figure 28:
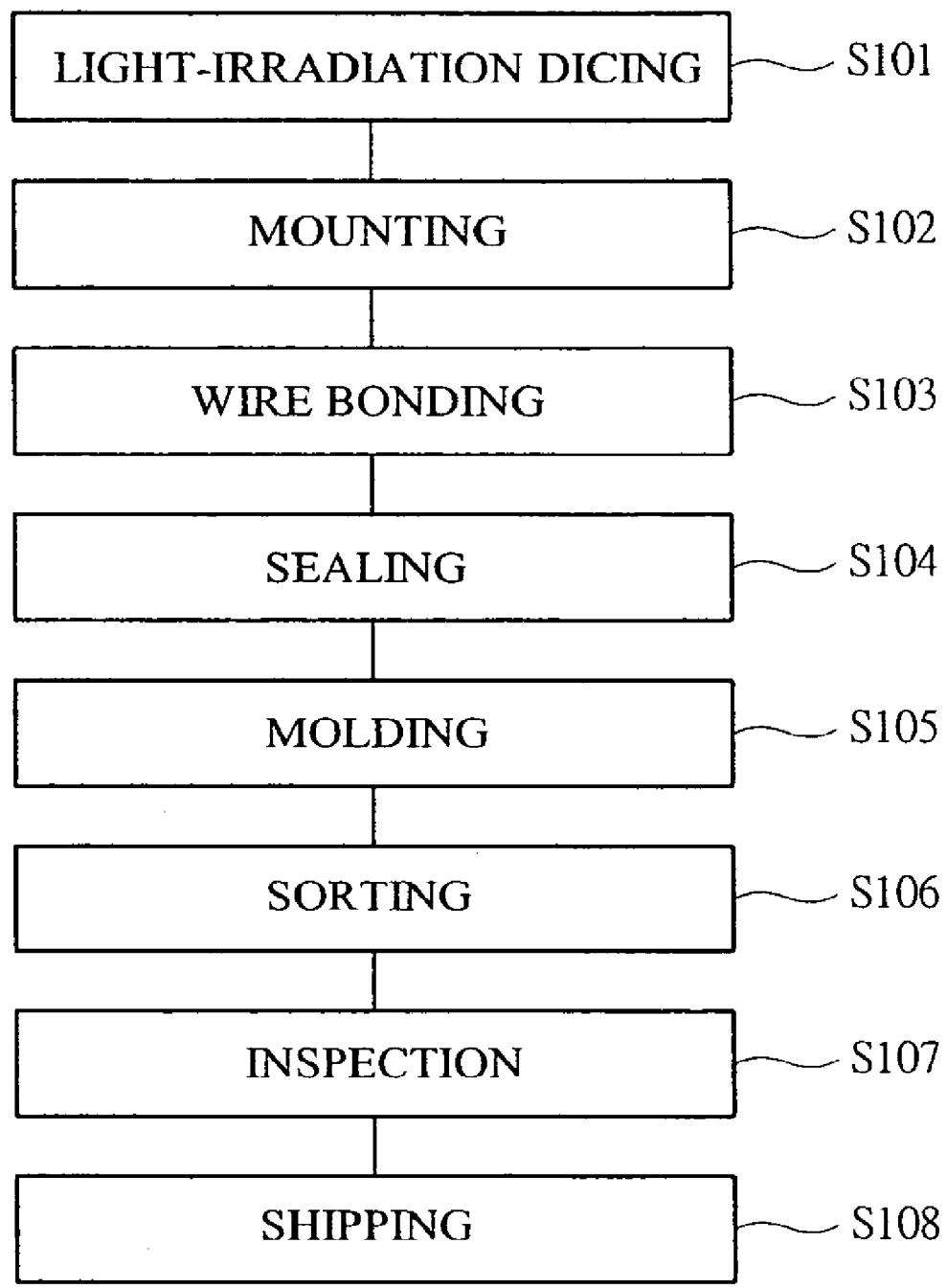
FIG. 28 is a flow chart showing the manufacturing process of a semiconductor device.

Next, as shown in FIG. 28, after light-irradiation dicing is performed (S101), the cut chip CP is mounted on a lead frame (S102). Then, the emitter electrode 55 and the base electrode 56 formed on the mounted chip CP are connected to leads on the lead frame by metal wires, respectively (S103).

Subsequently, the chip CP is sealed with resin (S104) and is molded into a package (S105). The packaged semiconductor devices are subjected to a sorting process (S106) and then inspected (S107). Thereafter, products determined as good products are shipped (S108).

According to the second embodiment, the same effect as that in the first embodiment can be obtained. More specifically, by providing the illumination devices 37a to 37c in the dicing device 1, light is irradiated on the entire surface of the element forming surface of the wafer 50 during dicing. Therefore, the corrosion due to a contact between the emitter electrode 55 or the base electrode 56 and a silicon piece can be prevented. Therefore, it is possible to prevent the manufacturing of a defective product in which the electrode 55 or the base electrode 56 is corroded or eliminated, and a manufacturing yield of the product can be increased.

Third Embodiment

In the second embodiment, dicing of one invention disclosed in this application has been described based on an example of a manufacturing method of a bipolar transistor. However, in a third embodiment, dicing of one invention disclosed in this application will be described below based on an example of a manufacturing method of an IC inlet.

The IC inlet is an assembly of a memory and an antenna, which includes an information storage integrated circuit element such as a mask ROM (Read Only Memory) or an EEPROM (Electrically Erasable Programmable Read Only Memory) and an antenna connected thereto. In the IC inlet, an electromagnetic wave such as a microwave is irradiated on the IC inlet, and an electromagnetic wave emitted from the IC inlet is received, thereby reading information written in the IC inlet. By this means, a place of origin, a producer, and quality of a product can be identified by the read information.

Figure 29:
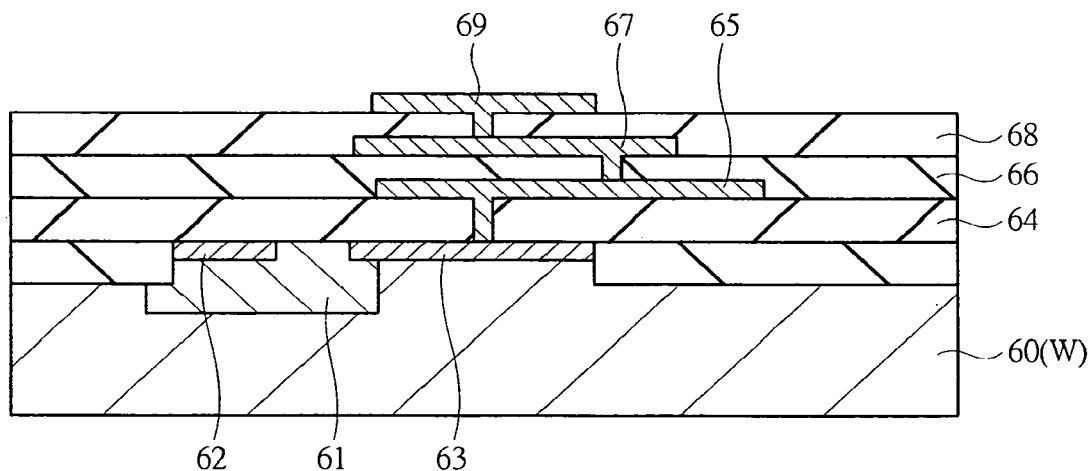
FIG. 29 is a sectional view showing a manufacturing process of a semiconductor device according to a third embodiment.

A manufacturing method of an IC inlet will be described below. First, a structure shown in FIG. 29 is formed by using a known technology. More specifically, an n type well 61 in which an n type impurity is doped and p type semiconductor regions 62 and 63 in which a p type impurity is doped are formed in a wafer 60. Then, after a silicon oxide film 64 is formed on the wafer 60 by CVD, a connection hole reaching the p type semiconductor regions 63 is formed in the silicon oxide film 64 through a photolithography process and an etching process.

Subsequently, a conductive film is formed on the silicon oxide film 64 so as to fill the connection hole. Then, an unnecessary conductive film formed on the silicon oxide film 64 is removed by CMP while leaving the conductive film in the connection hole, thereby forming a plug.

Next, an aluminum film is formed on the silicon oxide film 64 in which the plug is formed. The aluminum film can be formed by sputtering. Then, the aluminum film is patterned through a photolithography process and an etching process, thereby forming an interconnection 65.

Similarly, after a silicon oxide film 66 is formed on the interconnection 65, a plug connected to the interconnection 65 is formed in the silicon oxide film 66. Then, an interconnection 67 connected to the plug is formed on the silicon oxide film 66. The interconnection 67 is made of, for example, an aluminum film.

Next, after a silicon oxide film 68 is formed on the interconnection 67, a plug connected to the interconnection 67 is formed in the silicon oxide film 68. Then, an electrode 69 connected to the plug is formed on the silicon oxide film 68. The electrode 69 is formed of, for example, an aluminum film.

Figure 30:
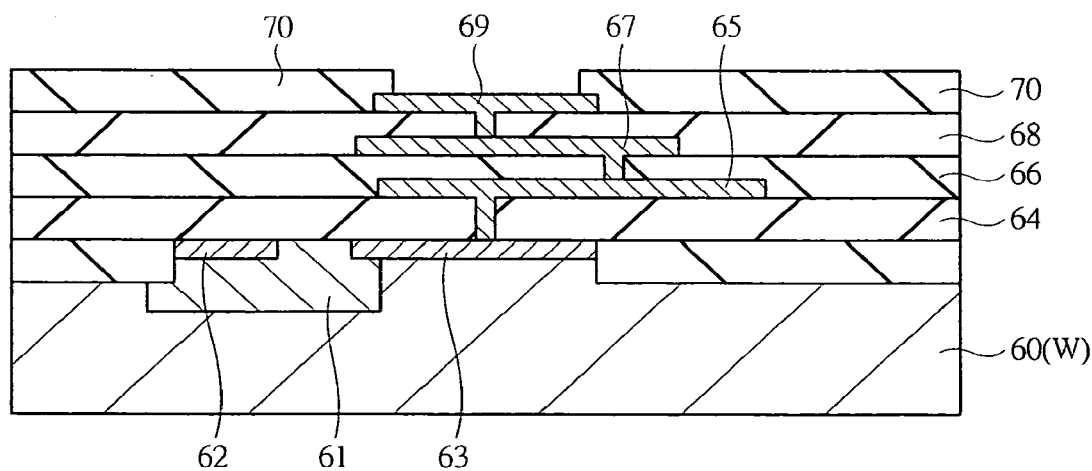
FIG. 30 is a sectional view showing a manufacturing process of a semiconductor device subsequent to FIG. 29.

Subsequently, as shown in FIG. 30, a silicon nitride film is formed on a main surface of the wafer 60 by CVD, thereby forming a surface protecting film 70 formed of the silicon nitride film. Then, the surface protecting film 70 is patterned through a photolithography process and an etching process. The surface protecting film 70 is patterned so as to expose the electrode 69.

Figure 31:
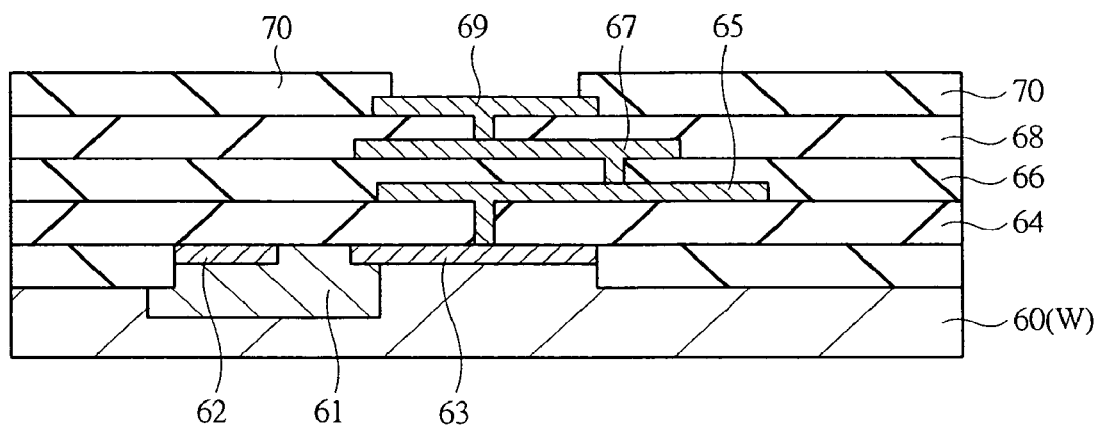
FIG. 31 is a sectional view showing a manufacturing process of a semiconductor device subsequent to FIG. 30.
Figure 32:
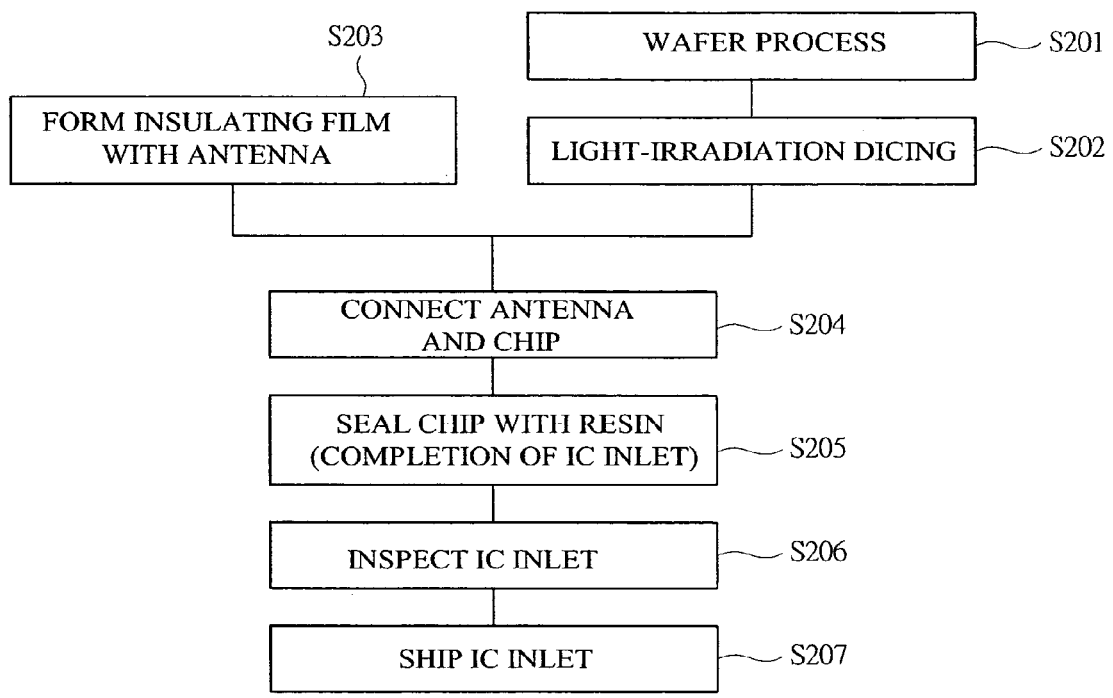
FIG. 32 is a flow chart showing the manufacturing process of a semiconductor device.

Next, as shown in FIG. 31, a rear surface of the wafer 60 is polished to reduce the thickness of the wafer 60. In this manner, the wafer process shown in FIG. 32 is performed (S201). Subsequently, light-irradiation dicing of the wafer 60 is performed (S202). The dicing is performed through the same process as that in FIG. 19 to FIG. 21 described in the first embodiment. More specifically, as shown in FIG. 19, after the dicing tape 9 is adhered on the rear surface of the wafer 60 (described as the wafer 30 in FIG. 19 to FIG. 21), as shown in FIG. 20, the wafer 60 is cut into respective chips CP while irradiating light on the entire surface of the element forming surface of the wafer 60. By this means, since a light-shielded area is not formed on the wafer 60 in the dicing process, the corrosion of the electrode 69 due to the adhesion of silicon pieces can be prevented.

On the other hand, an antenna is formed on an insulating film to form an insulating film with an antenna in a separate step (S203).

Next, the chip CP is connected to the antenna formed on the insulating film (S204). Then, the chip CP is sealed with resin to form an IC inlet (S205). Thereafter, the IC inlet is inspected (S206), and an IC inlet determined as a good product is shipped (S207).

According to the third embodiment, the same effect as that in the first embodiment can be obtained. More specifically, by providing the illumination devices 37a to 37c in the dicing device 1, light is irradiated on the entire surface of the element forming surface of the wafer 60 during dicing. Therefore, the corrosion due to a contact between the electrode 69 and a silicon piece can be prevented. Therefore, it is possible to prevent the manufacturing of a defective product in which the electrode 69 is corroded or eliminated, and a manufacturing yield of the product can be increased.

Fourth Embodiment

In a fourth embodiment, an example in which one invention disclosed in this application is applied to a dicing device having a structure different from that of the dicing device described in the first embodiment will be described.

Figure 33:
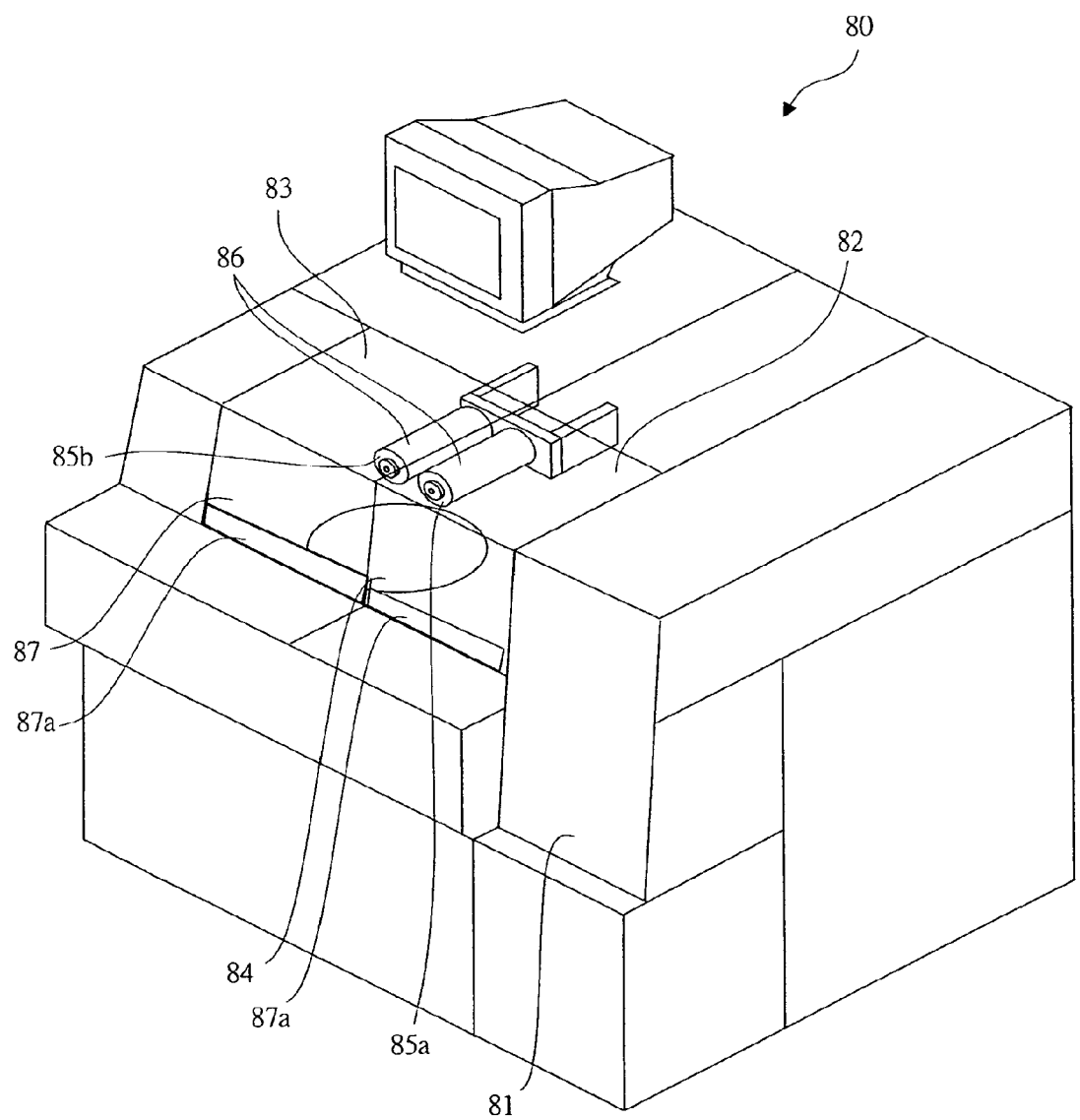
FIG. 33 is a diagram showing a dicing device according to a fourth embodiment.

FIG. 33 is a diagram showing a dicing device 80 in the fourth embodiment. In FIG. 33, the dicing device 80 according to the fourth embodiment has a wafer cassette chamber 81, an alignment chamber 82, a dicing chamber (dicing process unit) 83, a dicing stage 84, blades 85a and 85b, spindles 86, a cover 87, and illumination devices 87a.

Of these constituent elements, constituent elements different from those in the first embodiment will be described below. In the dicing device 80 according to the fourth embodiment, the alignment chamber 82 is provided. The alignment chamber 82 is provided to adjust a position where a wafer is diced, and a line for dicing is adjusted by an alignment camera (not shown). Since the alignment is performed by the spindle 5 in the first embodiment, an alignment chamber is not separately provided.

The illumination device 87a is provided inside the cover 87 formed on the front surface of the dicing device 80, and in this respect, it is different from the illumination device of the first embodiment which is formed inside the covers 8 on the front and side surfaces of the dicing device 1. The layout structures of the dicing devices are different from each other, but in any one of the devices, light is similarly irradiated on the entire surface of the element forming surface during dicing. Although the illumination device 87a is provided inside the cover, the illumination device 87a can be provided outside the cover when a transparent cover is used.

Also, a large difference between the dicing device 80 and the dicing device 1 according to the first embodiment is that arrangement positions of the blade (first dicing blade) 85a and the blade (second dicing blade) 85b used to cut a wafer are different from each other. More specifically, in the first embodiment, as shown in FIG. 2, the blades 4a and 4b are arranged in a direction crossing a dicing direction. Meanwhile, in the dicing device 80 according to the fourth embodiment, the blades 85a and 85b are arranged in a dicing direction. In other words, the blades 85a and 85b are held by the spindles 86 so that the blades 85a and 85b substantially belong to the same plane. Therefore, the dicing device 1 according to the first embodiment is different from the dicing device 80 according to the fourth embodiment in dicing operation.

A dicing operation of the dicing device 80 according to the fourth embodiment will be described below with reference to FIG. 34 and FIG. 35.

Figure 34:
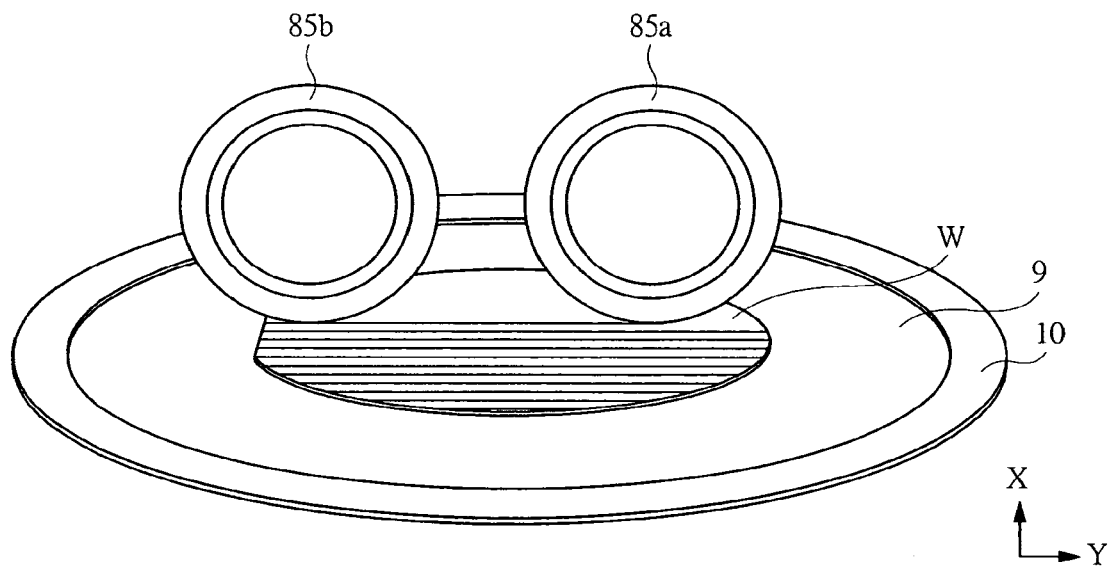
FIG. 34 is a diagram for describing a dicing operation.

FIG. 34 is a diagram showing the dicing by the dicing device 80. In FIG. 34, a wafer W is provided at a center portion of the frame 10 to which the dicing tape 9 is adhered, and is adhered to the dicing tape 9. When the wafer W is diced by the dicing device 80, the blades 85a and 85b are arranged in the dicing direction (Y direction). Therefore, one dicing line is simultaneously diced by the blades 85a and 85b. In this respect, the dicing device 80 is different from the dicing device 1 in which the blade 4a and the blade 4b are arranged in a direction crossing (perpendicular to) the dicing direction and the blade 4a and the blade 4b dice different lines, respectively.

The blade 85a has a cutting edge thicker than that of the blade 85b. First, the wafer W is cut to a depth which is almost half the thickness of the wafer W by the blade 85a having the relatively thick cutting edge. Then, the wafer W is completely cut out by the blade 85b having the relatively thin cutting edge. When dicing in a predetermined direction is completed in this manner, as shown in FIG. 35, the wafer W is rotated by 90° and then dicing is performed. Finally, the wafer W is cut into respective chips. In this example, the wafer W is completely cut out by the pair of blades 85a and 86b. However, the embodiment is not limited to this example, and the wafer W may be almost completely cut out or may be cut so as to leave a half or more part thereof.

Figure 36:
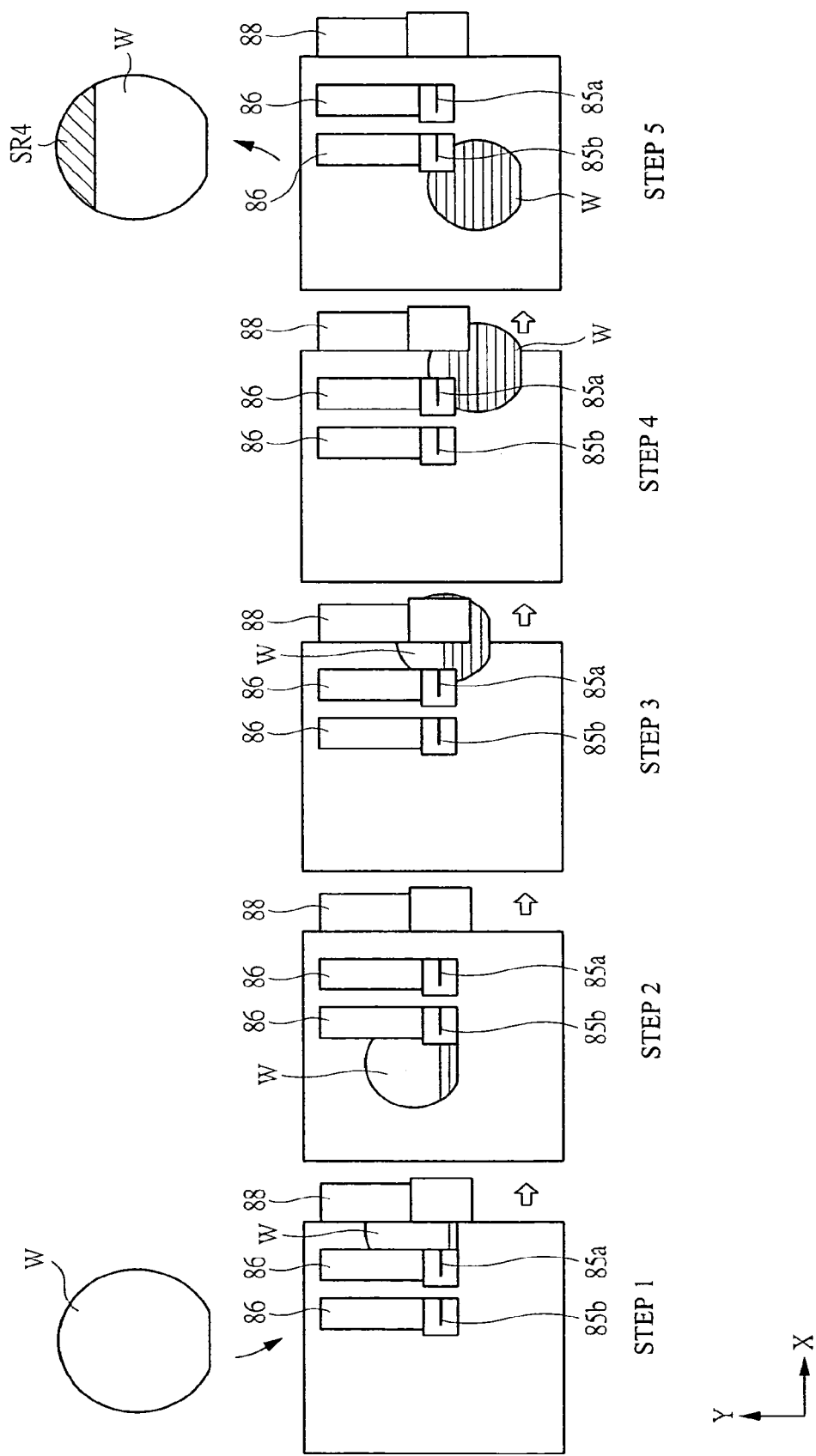
FIG. 36 is a diagram showing movement of a wafer during dicing.

Next, the movement of the wafer W during dicing will be described below with reference to FIG. 36 and FIG. 37. FIG. 36 is a diagram showing the dicing of the wafer W using the pair of blades 85a and 85b from above. As shown in FIG. 36, the wafer W is placed so that an orientation flat is parallel to an X axis. First, as shown in step 1, after the position of the wafer W is adjusted by an alignment camera 88, the wafer W is moved in a negative direction of the X-axis direction (from the right to the left), thereby dicing the wafer W. At this time, the wafer W passes under the alignment camera 88 and the spindles 86 and takes the state shown in a step 2. Subsequently, in order to change lines to be diced, the position of the wafer W is adjusted by the alignment camera 88 and the wafer W is slightly moved in the negative direction of the Y direction. Thereafter, as shown in step 2 to step 3, the wafer W is diced by moving the wafer W in a positive direction of the X axis (from the left to the right). Also at this time, the wafer W passes under the spindles 86 and the alignment camera 88.

Subsequently, as shown in step 4, after the wafer W is slightly moved in the negative direction of the Y direction, as shown in step 4 to step 5, the wafer W is diced by moving the wafer W in the negative direction of the X axis (from the right to the left). In this manner, the dicing in a predetermined direction is performed.

In the first embodiment shown in FIG. 6, an area SR1 which is behind the spindle 5 during the dicing in a predetermined direction is present in the area of the wafer W. In contrast to this, in the fourth embodiment shown in FIG. 36, an area which is remains behind the spindle 86 during the entire time of dicing in a predetermined direction is not present in the area of the wafer W. However, the wafer W temporarily passes under the spindle 86 and the alignment camera 88 during the dicing. Therefore, when the illumination device 87a is not provided in the dicing device 80, the area of the wafer W passing under the spindle 86 or the alignment camera 88 is a light-shielded area. For this reason, in an area which passes under the spindle 86 or the alignment camera 88 for a long time, the time for which light is not irradiated is relatively long if the illumination device 87a is not provided. In the dicing operation of the fourth embodiment, the area on which light is not irradiated for a relatively long time is an area SR4.

Figure 37:
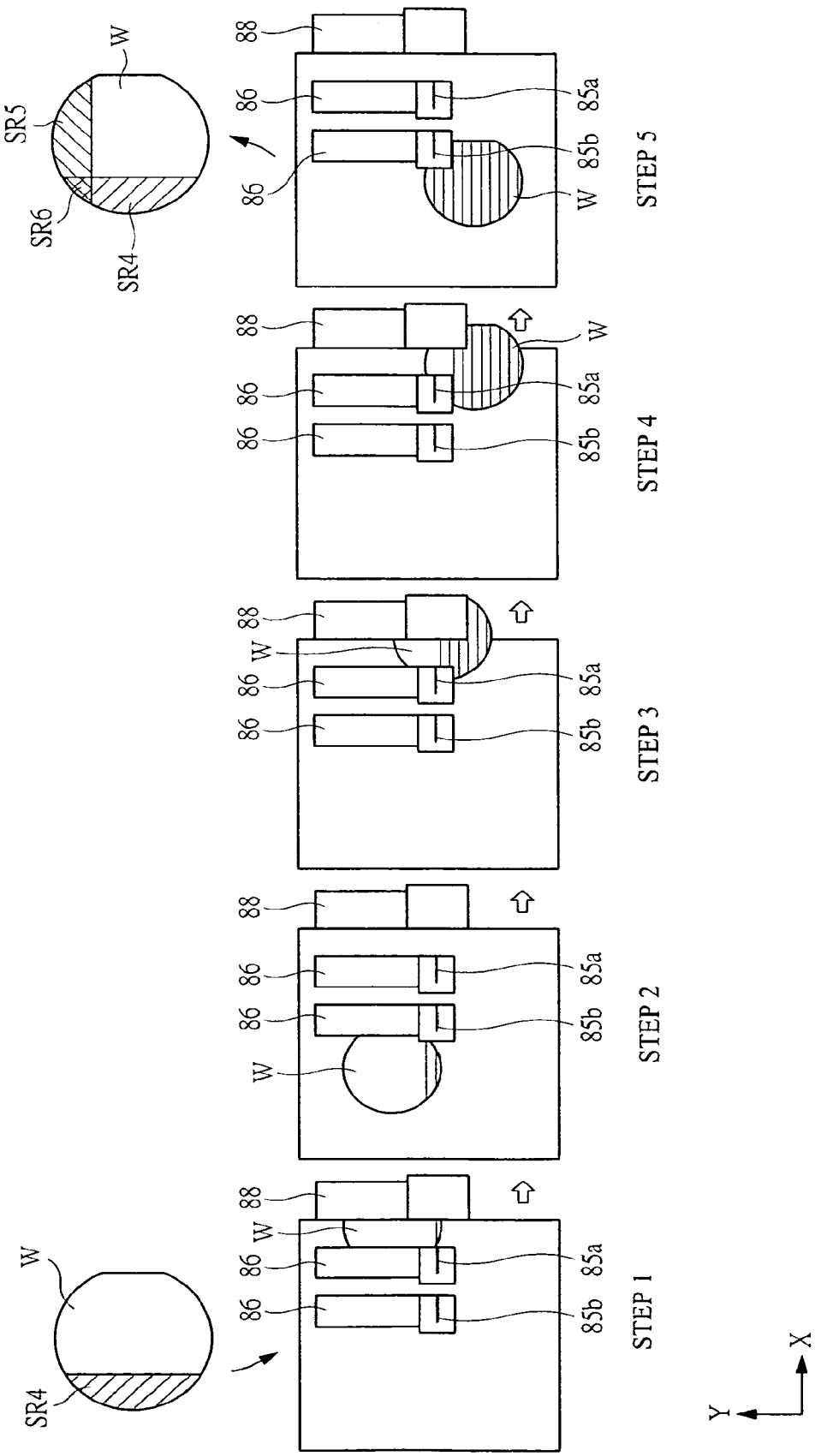
FIG. 37 is a diagram showing movement of a wafer during dicing.

Next, after the dicing operation shown in FIG. 36 is finished, as shown in FIG. 37, the wafer W is rotated by 90° and then dicing is performed. Also in this case, operations in step 1 to step 5 in FIG. 37 are performed in the same manner as that described in FIG. 36. However, in the case shown in FIG. 37, an area SR5 which passes under the spindle 86 or the alignment camera 88 for a relatively long time is present in the wafer W. As described above, in the dicing device which does not have the illumination device 87a, the area SR4 and the area SR5 in which light is relatively shielded are present. In particular, an area SR6 where the area SR4 and the area SR5 overlap passes under the spindle 86 or the alignment camera 88 for a long time in both the dicing operations in two directions which are perpendicular to each other. Accordingly, the light irradiation to the area SR6 is smallest in the wafer W.

Figure 35:
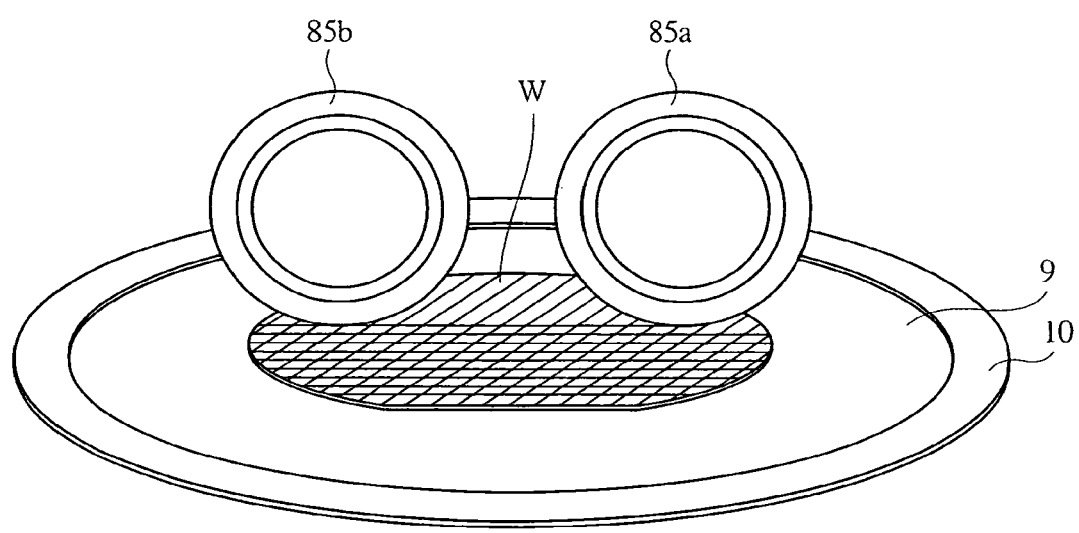
FIG. 35 is a diagram for describing a dicing operation.

In this case, the dicing device 80 according to the fourth embodiment has the illumination device 87a as shown in FIG. 35. The illumination device 87a is disposed to irradiate light on an entire surface of an element forming surface of the wafer W during a dicing operation. Therefore, even though the wafer W passes under the spindle 86 or the alignment camera 88, light is irradiated on the entire surface of the wafer W. More specifically, in the dicing device 80 according to the fourth embodiment, since the illumination device 87a is provided, the above-described areas SR4 to SR6 in which light is relatively shielded are not present.

Therefore, according to the manufacturing method of a semiconductor device using the dicing device according to the fourth embodiment, since the illumination device 87a is disposed so as to irradiate light on the entire surface of the element forming surface of the wafer W during dicing, corrosion due to a contact between an electrode formed on the wafer W and a silicon piece generated in the dicing can be prevented. Accordingly, the manufacture of a defective product in which the electrode is corroded or eliminated can be prevented, and a production yield can be increased.

In other words, according to the fourth embodiment, in the process where a scribe area is cut in two steps from a first main surface side by the blade 85a and the blade 85b held to belong to substantially the same plane while supplying water or chemical solution containing water as a main component to the first main surface of the wafer W on which a semiconductor device having an electrode containing aluminum as a main component is formed, an average illuminance of the first main surface is kept at 70 lux or more, and the illuminance on the first main surface is kept so that the minimum illuminance does not become lower than 70 lux at any positions on the first main surface. Therefore, corrosion due to a contact between an electrode formed on the wafer W and a silicon piece generated in dicing can be prevented.

Also in the fourth embodiment, when the average illuminance of light on the element forming surface of the wafer W and the minimum illuminance on the first main surface are approximately 70 lux or more, the effect of preventing the corrosion of the bonding pad 11 can be achieved. In particular, from a standpoint to effectively prevent the corrosion of the bonding pad 11, a conspicuous effect can be obtained when the average illuminance of light is set at 80 lux or more or 100 lux or more. Although an upper limit of the average illuminance of light irradiated on the element forming surface of the wafer W and the minimum illuminance on the first main surface are not specified from a standpoint to prevent the corrosion of the bonding pad, the illuminance is actually less than 2000 lux. Furthermore, from a standpoint to reduce a power consumption of the dicing device 1 to achieve the manufacturing cost reduction, the illuminance is desirably set to a minimum limit at which the effect can be obtained. Therefore, the average illuminance is desirably set at less than 1500 lux or less than 1300 lux, furthermore, less than 1200 lux.

Figure 38:
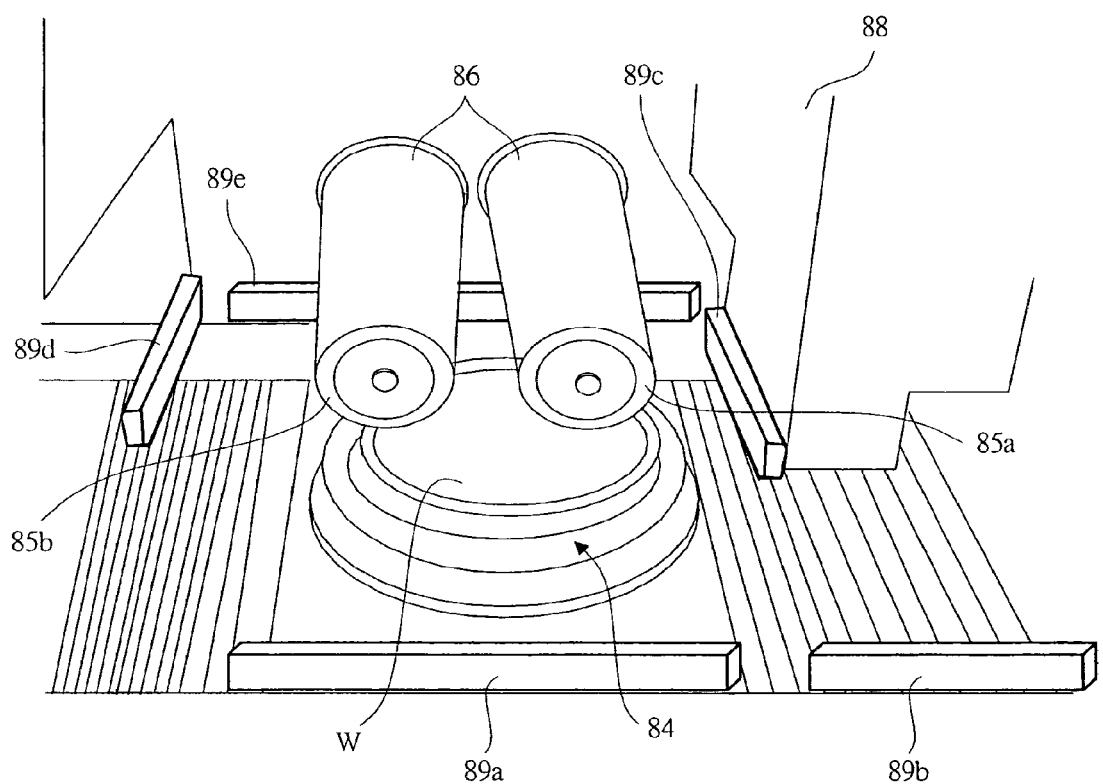
FIG. 38 is a diagram showing a modification example of the fourth embodiment.

In the dicing device 80 shown in FIG. 35, the illumination device 87a is provided in the cover 87. However, as shown in FIG. 38, for example, illuminance devices 89a to 89e may be arranged so as to surround a periphery of the dicing stage 84. By arranging the illuminance devices 89a to 89e as described above, light can be irradiated on the entire surface of the wafer W during dicing.

In the foregoing, the invention made by the inventors of the present invention has been concretely described based on the embodiments. However, it is needless to say that the present invention is not limited to the foregoing embodiments and various modifications and alterations can be made within the scope of the present invention.

Although the illumination devices are arranged in the dicing device according to the above embodiments, the arrangement of the illumination devices and a type of illumination light are not limited to those described in the embodiments. More specifically, any illumination light can be used as long as it has a wavelength of 1.1 μm or less when a wafer is made of silicon. Also, any arrangement of the illumination devices can be used as long as the light can be irradiated on the entire surface of the element forming surface of the wafer during a dicing operation.

In the embodiments described above, a diode, a bipolar transistor, and an IC inlet are shown as examples of a semiconductor device to be manufactured. However, the present invention is not limited to these examples, and the present invention can be widely applied to the manufacture of various semiconductor devices.

In the embodiments described above, an example in which the wafer is cut by using one pair of blades has been described. However, the present invention is not limited to this example. The manufacturing method of a semiconductor device described in the embodiments can be applied to a case where a wafer is cut by using one blade.

INDUSTRIAL APPLICABILITY

The effects obtained by typical aspects of the present invention will be briefly described below.

Since light is irradiated on a wafer by using illumination devices when dicing a wafer, corrosion of an electrode due to a silicon piece adhered to an electrode containing aluminum as a main component can be prevented.

What is claimed is:
1. A method of manufacturing a semiconductor device, the method comprising:
   (a) a step of placing a silicon wafer, on which a wafer process has been completed, on a dicing stage in a dicing process unit covered with a semi-transparent cover or a light-shielding cover in a dicing device; and
   (b) a step of performing a two-step cutting process to cut a scribe area from a first main surface of the silicon wafer by first and second dicing blades held so that side surfaces thereof are opposed to each other while supplying water, or a chemical solution containing water as a main component, to the first main surface of the silicon wafer on which a semiconductor device having electrodes containing aluminum as a main component is formed,
   wherein the step (b) is performed in a state where light is irradiated at any position on the first main surface of the silicon wafer from an illumination device provided in the dicing device, and
   the light irradiated from the illumination device has an energy equal to or larger than a bandgap of silicon.
2. The method of manufacturing a semiconductor device according to claim 1,
   wherein a processing time of the step (b) is 30 minutes or longer.
3. The method of manufacturing a semiconductor device according to claim 1,
   wherein a wavelength of the light irradiated from the illumination device is 1.1 μm or shorter.
4. A method of manufacturing a semiconductor device, the method comprising:
   (a) a step of placing a silicon wafer, on which a wafer process has been completed, on a dicing stage in a dicing process unit covered with a semi-transparent cover or a light-shielding cover in a dicing device; and
   (b) a step of performing a two-step cutting process to cut a scribe area from a first main surface of the silicon wafer by first and second dicing blades held so that side surfaces thereof are opposed to each other while supplying water, or a chemical solution containing water as a main component, to the first main surface of the silicon wafer on which a semiconductor device having electrodes containing aluminum as a main component is formed,
   wherein the step (b) is performed in a state where light is irradiated on the first main surface of the silicon wafer from a plurality of illumination devices arranged at different positions in the dicing device, and
   the light irradiated from the illumination devices has an energy equal to or larger than a bandgap of silicon.
5. A method of manufacturing a semiconductor device, the method comprising:
   (a) a step of placing a silicon wafer, on which a wafer process has been completed, on a dicing stage in a dicing process unit in a dicing device; and
   (b) a step of performing a two-step cutting process to cut a scribe area from a first main surface of the silicon wafer by first and second dicing blades held so as to belong to the same plane while supplying water, or a chemical solution containing water as a main component, to the first main surface of the silicon wafer on which a semiconductor device having electrodes containing aluminum as a main component is formed, wherein the step (b) is performed in a state where light is irradiated at any position on the first main surface of the silicon wafer from an illumination device provided in the dicing device, and the light irradiated from the illumination device has an energy equal to or larger than a bandgap of silicon.

6. A method of manufacturing a semiconductor device, the method comprising:
   (a) a step of placing a silicon wafer, on which a wafer process has been completed, on a dicing stage in a dicing process unit in a dicing device; and
   (b) a step of performing a two-step cutting process to cut a scribe area from a first main surface of the silicon wafer by first and second dicing blades held so as to belong to the same plane while supplying water, or a chemical solution containing water as a main component, to the first main surface of the silicon wafer on which a semiconductor device having electrodes containing aluminum as a main component is formed,
   wherein the step (b) is performed in a state where light is irradiated on the first main surface of the silicon wafer from a plurality of illumination devices arranged at different positions in the dicing device, and
   the light irradiated from the illumination devices has an energy equal to or larger than a bandgap of silicon.

7. A method of manufacturing a semiconductor device, the method comprising:
   (a) a step of placing a silicon wafer, on which a wafer process has been completed, on a dicing stage in a dicing process unit in a dicing device; and
   (b) a step of cutting a scribe area from a first main surface of the silicon wafer by a dicing blade while supplying water, or a chemical solution containing water as a main component, to the first main surface of the silicon wafer on which a semiconductor device having electrodes containing aluminum as a main component is formed,
   wherein the step (b) is performed in a state where light is irradiated at any position on the first main surface of the silicon wafer from an illumination device provided in the dicing device, and
   the light irradiated from the illumination device has an energy equal to or larger than a bandgap of silicon.

8. A method of manufacturing a semiconductor device, the method comprising:
   (a) a step of placing a silicon wafer, on which a wafer process has been completed, on a dicing stage in a dicing process unit in a dicing device; and
   (b) a step of cutting a scribe area from a first main surface of the silicon wafer by a dicing blade while supplying water, or a chemical solution containing water as a main component, to the first main surface of the silicon wafer on which a semiconductor device having electrodes containing aluminum as a main component is formed,
   wherein the step (b) is performed in a state where light is irradiated on the first main surface of the silicon wafer from a plurality of illumination devices arranged at different positions in the dicing device, and
   the light irradiated from the illumination devices has an energy equal to or larger than a bandgap of silicon.

* * * * *